US007262722B1

(12) United States Patent
Jahanghir et al.

(10) Patent No.: US 7,262,722 B1
(45) Date of Patent: Aug. 28, 2007

(54) HARDWARE-BASED CABAC DECODER WITH PARALLEL BINARY ARITHMETIC DECODING

(75) Inventors: Musa Jahanghir, Palo Alto, CA (US); Munsi A. Haque, San Jose, CA (US); Prasanna Singamsetty, San Jose, CA (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 11/474,897

(22) Filed: Jun. 26, 2006

(51) Int. Cl.
*H03M 7/00* (2006.01)
(52) U.S. Cl. ............................ 341/107; 341/65; 341/67
(58) Field of Classification Search ................ 341/106, 341/67, 65, 107; 326/37–40; 708/230–236
See application file for complete search history.

(56) References Cited

U.S. PATENT DOCUMENTS

| | | | | |
|---|---|---|---|---|
| 6,049,399 A * | 4/2000 | Shyu | ........................... | 358/520 |
| 6,256,653 B1 * | 7/2001 | Juffa et al. | .................. | 708/290 |
| 6,327,005 B1 * | 12/2001 | Han | ............................ | 348/714 |
| 6,362,831 B1 * | 3/2002 | Shyu | ........................... | 345/600 |
| 6,611,214 B1 * | 8/2003 | Watkins | ....................... | 341/51 |
| 6,781,529 B1 * | 8/2004 | Lin et al. | ..................... | 341/106 |
| 6,798,240 B1 * | 9/2004 | Pedersen | ...................... | 326/39 |
| 6,856,701 B2 * | 2/2005 | Karczewicz et al. | ........ | 382/247 |
| 6,943,580 B2 * | 9/2005 | Lewis et al. | .................. | 326/40 |
| 6,995,694 B1 * | 2/2006 | He et al. | ....................... | 341/58 |
| 7,055,018 B1 * | 5/2006 | Bratt et al. | ..................... | 712/4 |
| 7,185,035 B1 * | 2/2007 | Lewis et al. | ................. | 708/235 |
| 7,199,733 B2 * | 4/2007 | Chi et al. | ...................... | 341/67 |
| 2006/0294174 A1 | 12/2006 | Haque et al. | | |

OTHER PUBLICATIONS

Detlev Marpe et al., "Context-Based Adaptive Binary Arithmetic Coding in the H.264/AVC Video Compression Standard", IEEE Transactions on Circuits and Systems for Video Technology, vol. 13, No. 7, Jul. 2003. ISSN: 1051-8215, pp. 620-636.

* cited by examiner

*Primary Examiner*—Linh Nguyen
(74) *Attorney, Agent, or Firm*—Buckley, Maschoff & Talwalkar LLC

(57) ABSTRACT

A binary arithmetic decoding apparatus includes first, second and third pairs of look-up tables and first, second and third multiplexers. The first multiplexer selects between the respective outputs of the two look-up tables of the first pair of look-up tables. The second multiplexer selects between the respective outputs of a first look-up table of the second pair of look-up tables and of a first look-up table of the third pair of look-up tables. The third multiplexer selects between the respective outputs of a second look-up table of the second pair of look-up tables and of a second look-up table of the third pair of look-up tables. The three multiplexers are controlled in common.

20 Claims, 14 Drawing Sheets

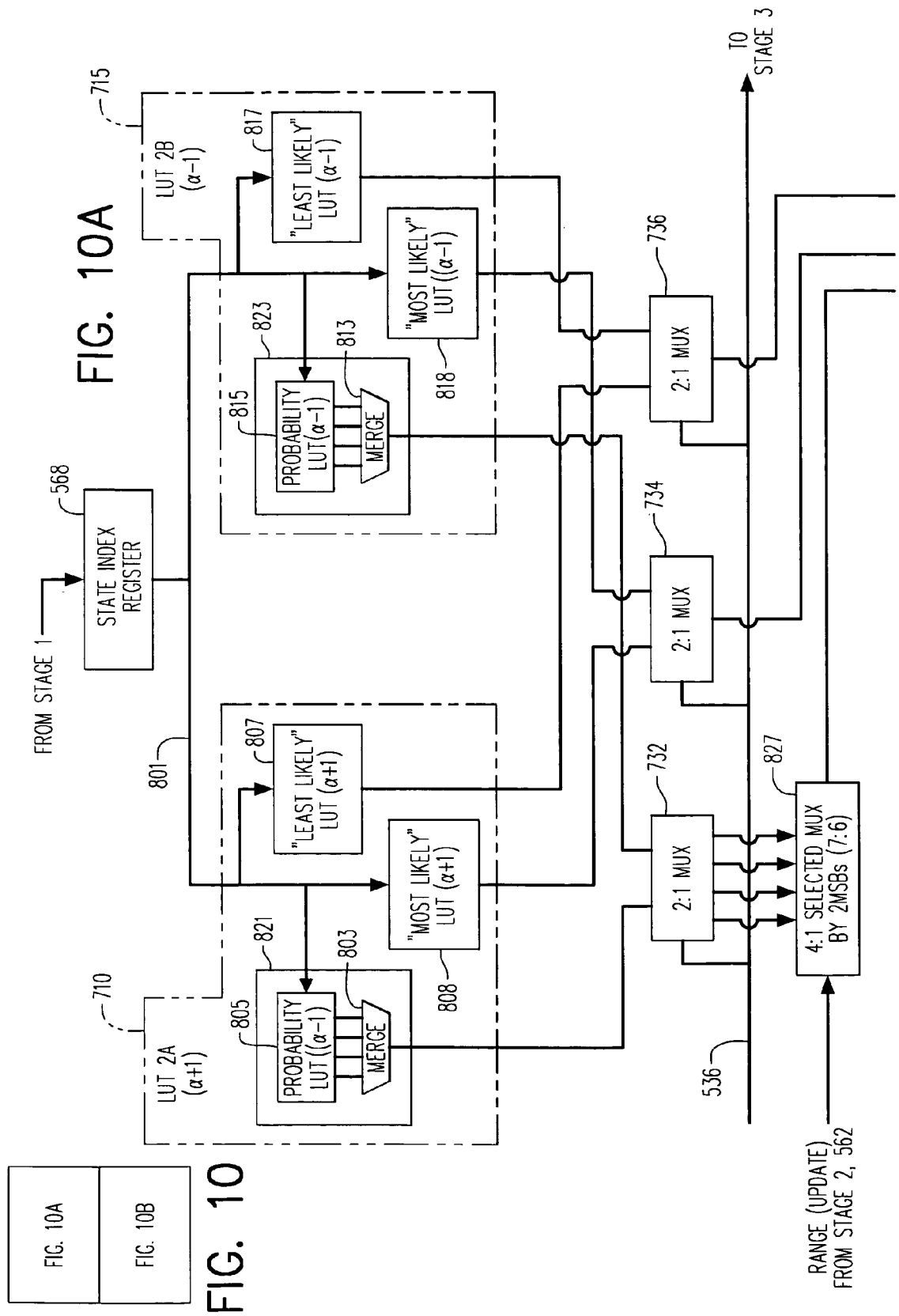

HARDWARE-BASED CABAC DECODER WITH PARALLEL BINARY ARITHMETIC DECODING

BACKGROUND

The AVC-H.264 video data compression-coding standard is well known and represents a new generation of video compression-coding that is expected to supersede the widely used MPEG-2 standard for many applications. AVC-H.264 achieves higher compression ratios than MPEG-2 but at the cost of greater processing complexity. In some aspects AVC-H.264 is similar to MPEG-2; for example, both utilize motion compensation to match current pixel blocks with reference pixel blocks to minimize the differential data that is to be transform-encoded.

One compression encoding option offered under AVC-H.264 calls for use of CABAC (context-based adaptive binary arithmetic coding) of syntax elements produced by transform-encoding (including motion vector information and other side data). CABAC potentially offers substantial additional compression efficiency relative to other types of later-stage encoding, but requires considerable processing complexity, particularly in regard to decoding. CABAC decoders for AVC-H.264 have been written in software for execution on general purpose processors, but the resulting decoder performance has been less than satisfactory in terms of throughput, especially for decoding a high resolution signal. Furthermore, CABAC software or hardware decoding of a bin also may occur before a next bin may be decoded, which may create bottlenecks.

DETAILED DESCRIPTION

Figure 1:
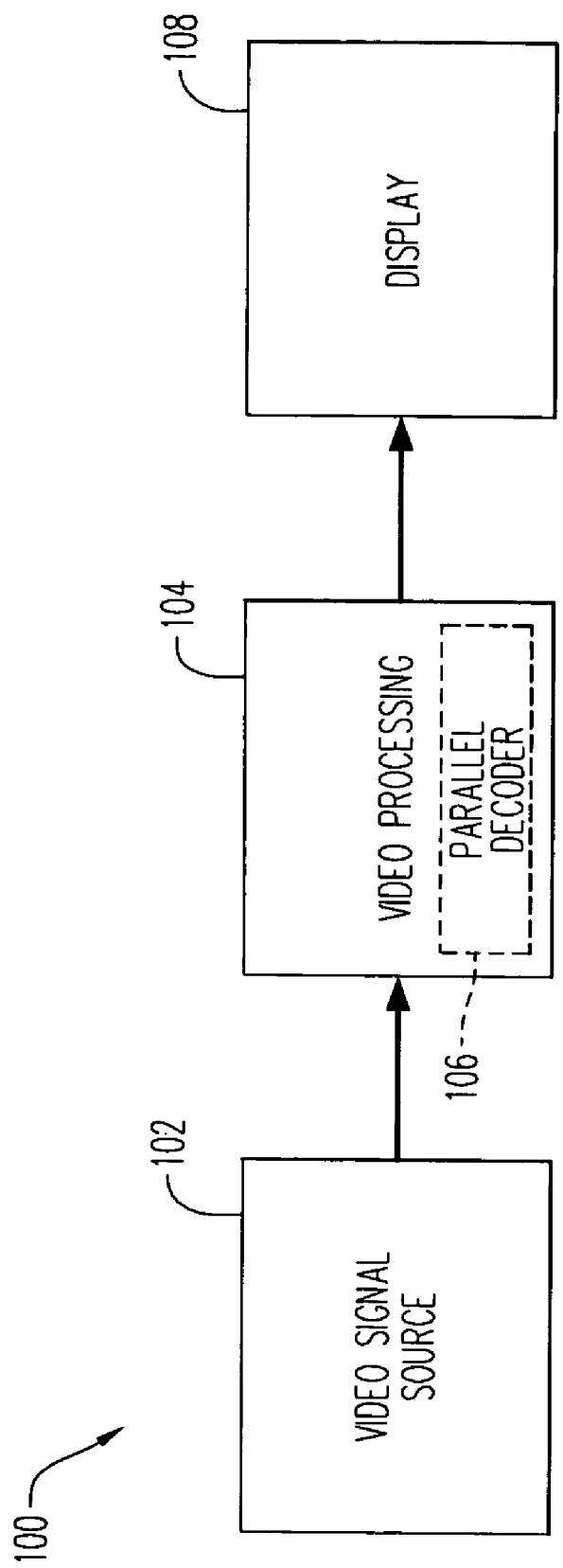
FIG. 1 is a block diagram showing components of a video signal reproduction system according to some embodiments.

FIG. 1 is a block diagram showing components of a video signal reproduction system 100 according to some embodiments.

The system 100 includes a video signal source 102. The video signal source 102 may be, for example, a receiving circuit which receives a compression-encoded video signal from, e.g., an over-the-air broadcast or from a cable television transmission. In addition or alternatively, the video signal source 102 may reproduce the video signal from a recording or storage medium such as a hard drive or a disk- or tape-shaped removable recording medium. The video signal may have been compression-encoded in accordance with the well-known AVC-H.264 standard, and CABAC (context-based adaptive binary arithmetic coding) may have been used as part of the compression encoding process that produced the compression-encoded video signal.

The system 100 also includes a video signal processing block 104 that is coupled to the video signal source 102. The video signal processing block 104 applies various processes to the compression-encoded video signal provided by the video signal source 102 to allow the video signal to be displayed. A major component of the video signal processing block 104 is a parallel decoder 106 (shown in phantom) which reverses the compression-encoding that was applied to the video signal. Aspects of the parallel decoder 106 will be the primary subjects of this disclosure. The parallel video decoder 106 is suitable for decoding a plurality of bins of an AVC-H.264/CABAC-encoded video signal in a substantially parallel manner, and may have other capabilities as well.

Still further, the system 100 includes a display component 108 (e.g., a CRT or a flat panel display) to display the video signal after it has been decoded and possibly subjected to other processing by the video signal processing block 104.

Figure 2:
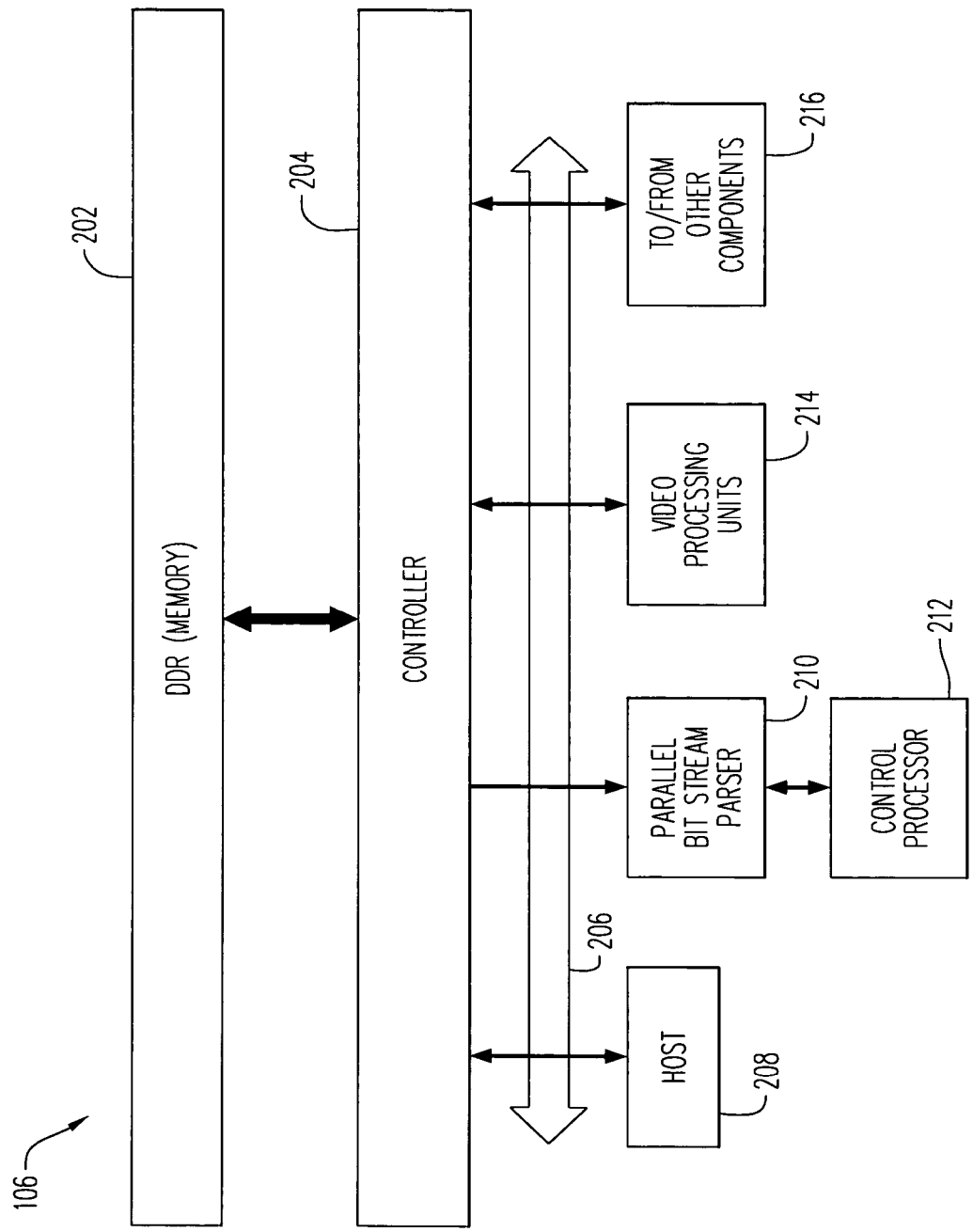
FIG. 2 is a block diagram which illustrates data flows in a video decoder block that is part of the system of FIG. 1.

FIG. 2 is a block diagram which illustrates data flows in the parallel decoder block 106.

The parallel decoder 106 includes one or more memory devices, which are indicated at 202 and which may be dual data rate (DDR) memory devices. The DDR memory 202 may store both compression-encoded video signals as well as video signals in a condition after decoding.

The parallel decoder 106 further includes a memory controller 204 which is coupled to the DDR memory 202. The memory controller 204 controls storage of video data in, and retrieval of video data from, the memory 202. The parallel decoder 106 may also include a bus 206. The bus 206 may, for example, operate in accordance with the well-known MBUS standard, and may allow data communication among the memory controller 204, and other components of the parallel decoder 106. Such other components may include a host processor 208, a parallel bitstream parser (PBSP) 210, a control processor 212 which is coupled to and manages the PBSP 210, other video signal processing units 214 and still other components which are represented by a block 216.

For the most part, the balance of this disclosure is concerned with certain aspects of the PBSP 210. As will be seen, the PBSP 210 is operative to receive and process a CABAC-encoded bitstream in parallel wile expanding the incoming bits to a stream of bins and then translating the bins into a sequence of AVC-H.264 syntax elements. The video processing units 214 reconstitute the video signal into reproducible form (e.g., by reconstructing macroblocks of the video signal) based on the residual transform data, motion vectors and other information represented by the syntax elements output from the bitstream parser.

Figure 3:
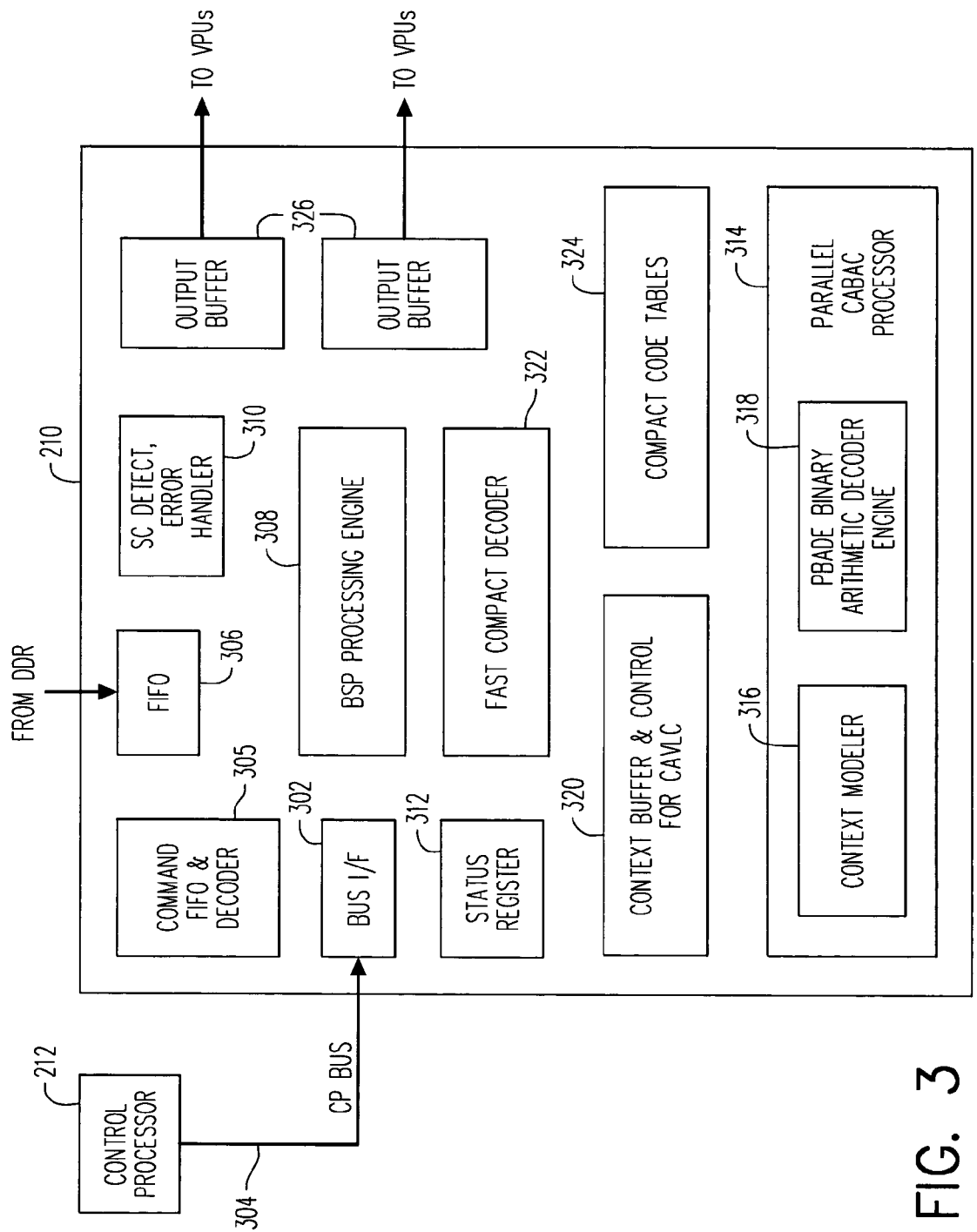
FIG. 3 is a block diagram which shows some details of a bitstream parser block that is part of the video decoder block of FIG. 2.

FIG. 3 is a block diagram which shows some details of the PBSP 210. The PBSP 210 includes a bus interface 302 which is connected to a control processor bus 304. The PBSP 210 engages in data messaging with the control processor 212 via the bus interface 302 and the control processor bus 304. The control processor 212 provides control functions for the PBSP 210 via signals received at the bus interface 302. Commands from the control processor 212 are temporarily stored and are decoded in a command buffer and decoder indicated at 305 as also being part of the PBSP 210.

The PBSP 210 also includes a first-in-first-out (FIFO) memory 306 which receives the input bitstream from the memory 202 (FIG. 2) via the memory controller 204 (also shown in FIG. 2, not FIG. 3). A processing element 308 that is part of the PBSP 210 provides control instructions and "side information" for other components of the PBSP 210.

Also included in the PBSP 210 is a start code detection and error handling block 310. An additional component of the PBSP 210 is a status register 312, which stores status messages to be provided to the control processor 212 via the bus interface 302 and the control processor bus 304.

The PBSP 210 further includes a parallel CABAC-decode processor 314 which is of central relevance to the present disclosure. The parallel CABAC-decode processor 314 includes a context modeler block 316 and a parallel binary arithmetic decoder engine (PBADE) 318, both of which are described in detail below. The context modeler block 316, may provide some context probability state information to the PBADE 318, which may use the context indexing information to help perform parallel bit-to-bin expansion on input bits from the FIFO memory 306 based on the context probability state information.

The PBSP 210 may also include circuitry (indicated at 320) to implement CAVLC (context-adaptive variable length coding) decoding, so that the PBSP 210 can also handle decoding of compression-encoded video data that has been encoded with the CAVLC option of AVC-H.264 rather than with the CABAC option.

In addition, the PBSP 210 includes a variable length decoder block 322 (referred to as a "fast compact decoder" or "FCD"), which receives a stream of bins from the PBADE 318 and matches the bins against code words to translate the bins into a sequence of AVC-H.264 syntax elements. Also included in the PBSP 210 are code tables 324 used by the FCD 322 to translate the bins into syntax elements. Still further, the PBSP 210 includes one or more output buffers 326 for storing the syntax elements prior to the syntax elements being supplied to the video signal processing units 214 (FIG. 2, not shown in FIG. 3).

Figure 4:
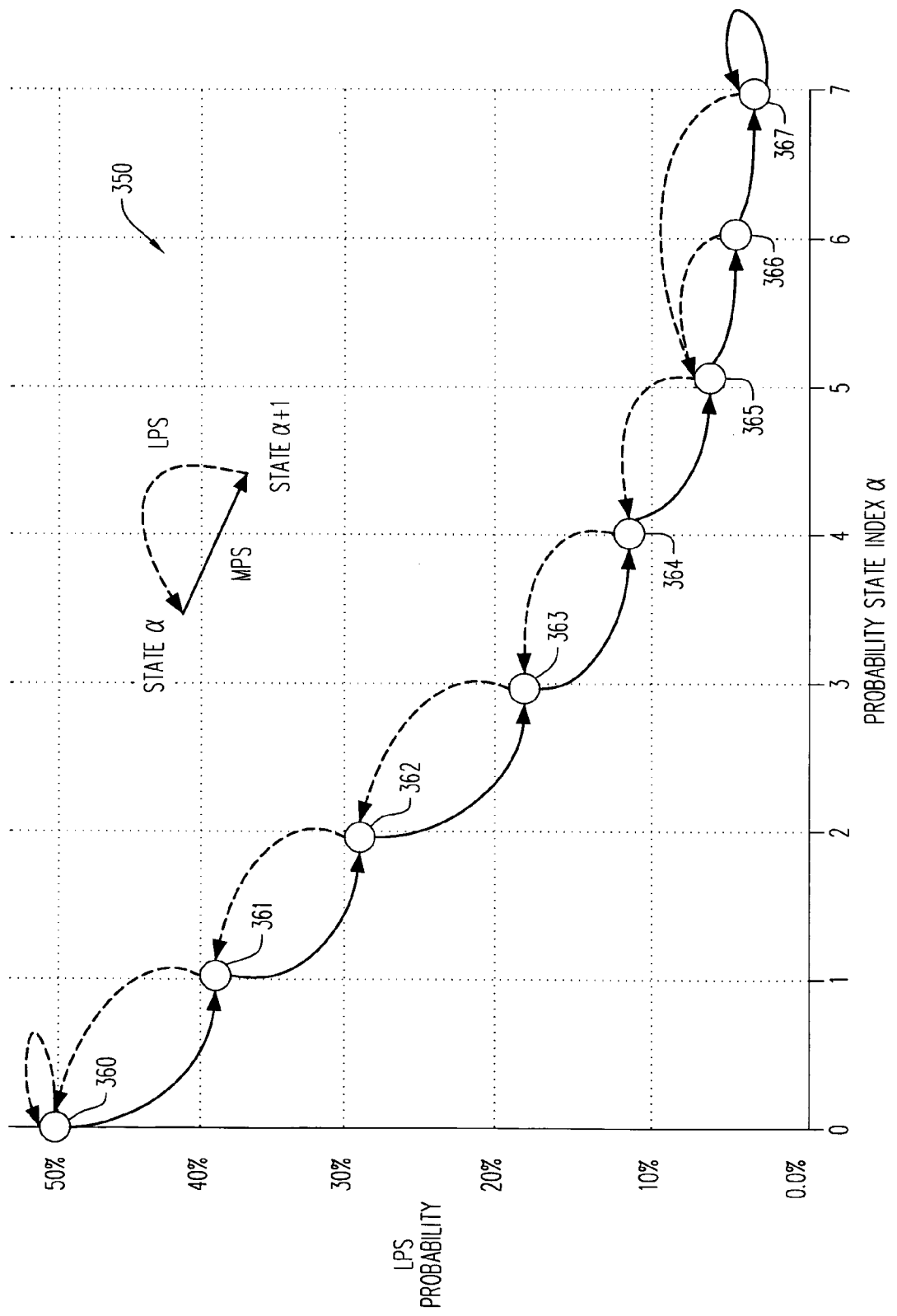
FIG. 4 is a figure illustrating the transitions of $\hat{\alpha}$ states in some embodiments.

FIG. 4 illustrates an exemplary graph of context states that may be used in connection with parallel CABAC-decode processor 314. Generally, a context can be defined as an aggregate amount of information that can be associated with an index number. For ease of explanation, in reference to parallel CABAC-decode processor 314, each context is related to a probability state index number 0-7 (such that there are eight contexts in this example), although in other embodiments, other numbers of probability states may be used. Each probability state index number is referred to as $\alpha$. Each $\alpha$ corresponds to a "context" that represents the purported odds that a predicted bin value is incorrect when the predicted bin value is compared to an actual bin value.

For example, it is determined within parallel CABAC processor 314 that a most probable bin (MPB; sometimes alternatively referred to as a more probable bin, a more or most likely bin—MLB—or a more or most probable symbol—MPS) value at time "n" is a "1" (i.e., the bin value is more likely to be a "1"). The $MPS_n$ also has an associated probability state. The $MPS_n$ has a corresponding $LPS_n$ which in binary arithmetic is the inverse of the $MPS_n$. (LPS refers to "least probable symbol", which may also be referred to as the less likely symbol—LLS, or for present purposes the less or least probable bin—LPB or the less or least likely bin—LLB.) The $LPS_n$, also has an associated probability state, which is the compliment of the $MPS_n$ probability state. The $LPS_n$ probability state gives a percentage chance that the $MPS_n$ value is incorrect.

Then, after a determination is made as to whether the MPS value is indeed the actual value to be encoded or decoded, a transition is made to a next $\alpha$ state based upon this determination. In FIG. 4, whether the prediction of the bin turns out to be correct or incorrect controls to which probability state $\alpha$ the parallel CABAC-decode processing block 314 transitions.

For instance, if in $\alpha$ state 3, there is a 20% chance that the predicted MPS is wrong (i.e., there is a 20% probability that the LPS value is the correct value). If the MPS is predicted accurately (i.e., the MPB value is compared against an actual bin value and the two are equal), $\alpha$ state 3 transitions to $\alpha$ state 4. $\alpha$ state 4 purports to have a 90% chance of predicting its own corresponding $MPS_n$ i.e., the next bin value to be encoded or decoded. This can represent an increased confidence in predicting the next bin value ($MPS_n+_1$). (For instance, according to FIG. 4, there is a 10% chance of LPS for n+1 corresponding bin value when compared to the $MPS_n$).

However, if the MPS is predicted inaccurately, (i.e., the MPS value is compared against an actual bin value and the two are not equal), $\alpha$ state 3 transitions to $\alpha$ state 2. $\alpha$ state 2 purports to have a 70% chance of predicting its own corresponding MPS. (For instance, according to FIG. 4, there is a 30% chance of LPS for the n+1 corresponding bin value). This can represent a decreased confidence in predicting the next value ($MPS_{n+1}$).

A probability state table, such as illustrated in FIG. 4, may be used by the parallel CABAC-decode processing block 314, as will be described below.

Figure 5:
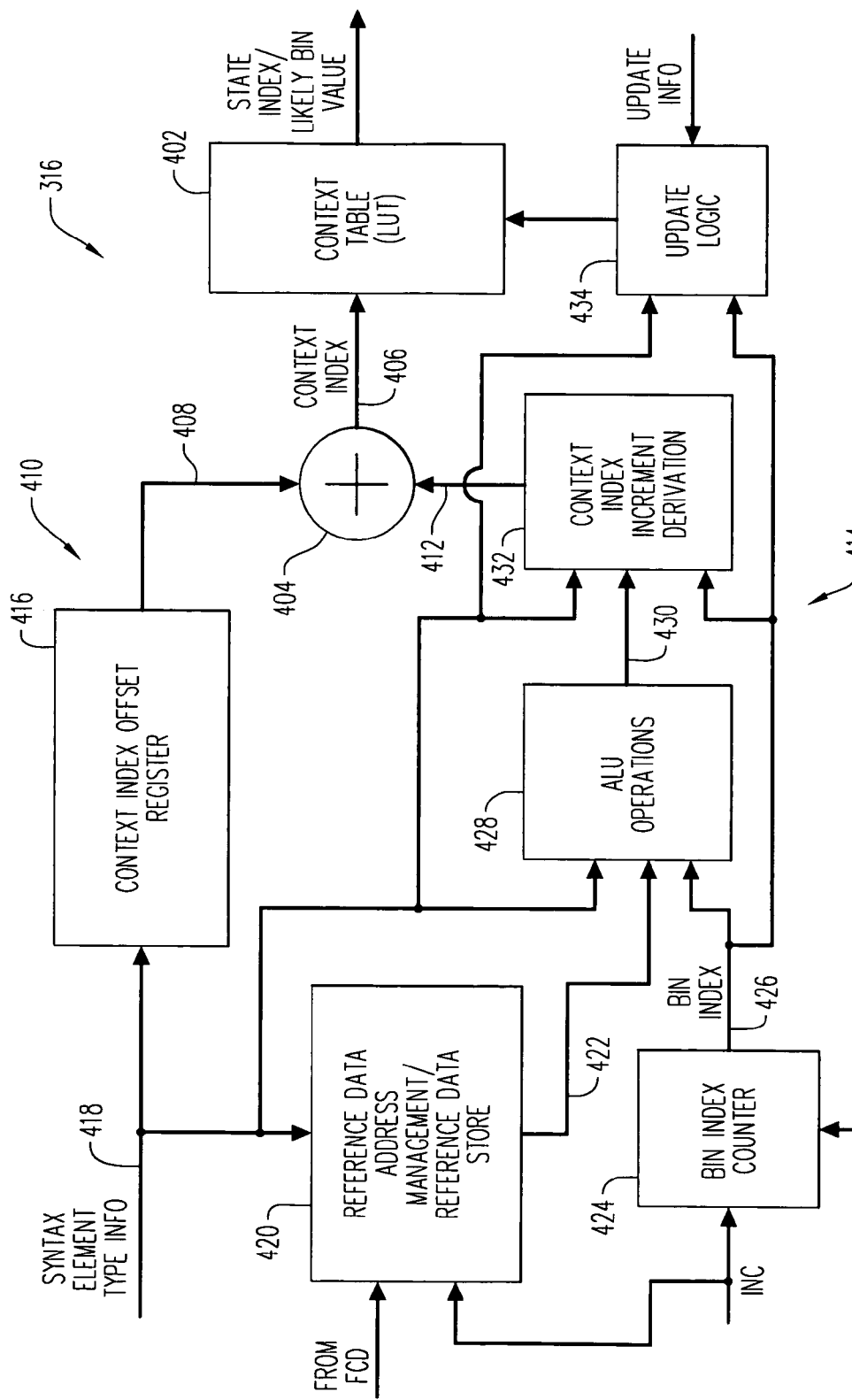
FIG. 5 is a block diagram which shows some details of a parallel context modeler block that is part of the bitstream parser block of FIG. 3.

FIG. 5 is a block diagram which shows some details of the context modeler block 316. In particular, FIG. 5 illustrates an architecture for a hardware implementation (i.e., a hardware accelerator) for the context modeling aspects of parallel CABAC-decoding. The architecture of FIG. 5 allows for determination of the appropriate context model for parallel current bit/bins in just a few clock cycles, thus promoting a practical and efficient hardware-based approach to parallel CABAC-decoding. The ensuing discussion, and the subsequent discussion of the PBADE, both assume that the reader is generally familiar with the concepts of binary arithmetic coding and is also familiar with CABAC-encoding, as described in the AVC-H.264 standard. However, examples of binary arithmetic coding and the use of context/probability states will be used as examples to help illustrate examples of use of the present description.

Each "slice" of the video signal contains a different type of syntax elements. For each syntax element within a slice, there are up to N bins ($b_1, b_2, \ldots, b_N$) based on the type of binarization that was performed. There may be one or more context labels associated with each of the bins. If there is more than one context label associated with a bin, then there are specific rules to select the appropriate context to use. Each of these context labels represent an aggregate of information associated with each bin.

A "context model" is a probability model for one or more bins of a binarized symbol (syntax element). This context model may be chosen from a selection of available models depending on the statistics of recently-decoded syntax elements. The context model stores the probability of each bin being "1" or "0", such as discussed regarding the example of FIG. 4. The context modeler block 316 operates to select the context model to be used by the PBADE 318 for decoding a current bin.

In the CABAC-encoding called for by the AVC-H.264 standard, there are a total of 460 separate context models for the various syntax elements. Entries for these context models are stored in a look-up table 402 that is part of the context modeler block 316. Each entry includes a 6-bit probability state index and the binary (one bit) value of the most probable bin value. These seven bits together define a context index to be provided to the PBADE 318. For instance, although for ease of illustration, FIG. 4 was illustrated as having 8 α states, there could instead be $2^6$, or 128 α states, each with its own LPS probability (and therefore, an implicit MPS probability). As detailed above, for a MPS value that is associated with a context state α when encoding or decoding; the context state gives purported odds that the MPS is indeed going to be the correct value.

The context models are initialized at the beginning of each slice and also at the beginning of each frame. The seven bit index entries of context states may be calculated by the control processor 212 (FIGS. 2 and 3) or by the processing element 308 at the start of the slice and stored in a local RAM (not separately shown) to constitute the look-up table 402.

The parallel context modeler block 316 also includes an adder 404 which has its output coupled to the look-up table 402. The adder 404 calculates a context index signal 406 which is supplied to the look-up table 402 to select the context information (state index and most likely bin value) to be output from the look-up table from among the context information stored in the look-up table 402. As adder inputs the adder 404 receives a context index offset signal 408 from a first circuit branch 410 and a context index increment signal 412 from a second circuit branch 414.

(The adder 404 may be considered to be one example of a "combiner". As used herein and in the appended claims, "combiner" refers to an adder or any other circuit that produces a sum from two or more input values.)

In some embodiments, the first circuit branch 410 includes a context index offset register 416. The context index offset register is coupled to receive an input signal 418. The input signal 418 may indicate what type of syntax element (or prefix or suffix portion of syntax element) is currently being decoded. Based on the input signal 418, the context index offset register selects the value of the context index offset signal 408 to be output to the adder 404. Thus effectively the context index offset register may function as a look-up table.

In some embodiments, the first circuit branch 410 may include two offset registers (not separately shown). In such embodiments, one of the registers always outputs an offset value to the adder 404, while the other register outputs to the adder 404 a second offset value only in cases where the current syntax element is of a type that represents a block of transform coefficients. Thus in some embodiments, the adder 404 may, in some circumstances, receive three inputs rather than the two inputs 408 and 410 indicated in FIG. 5.

In any case, the first circuit branch 410 operates to output, based on the type of the current syntax element to be decoded, an offset to be used in calculating the index signal for the look-up table 402.

In some embodiments, the second circuit branch 414 includes a reference data block 420. The reference data block 420 is coupled to receive the input signal 418, mentioned above, which indicates the type of the current syntax element. The reference data block is also coupled to the FCD 322 (FIG. 3, not shown in FIG. 5) and also to the "INC" signal supplied to the bin index counter described below, in some cases to receive from the FCD 322 data which indicates previously decoded syntax elements. These syntax elements are stored in the reference data block 420 as reference data that is used together with other inputs to determine the context index increment signal 412. The previously decoded syntax elements may be from the same slice (image or image segment) as the current syntax element that is being decoded. For example, in some embodiments, the syntax elements data stored in the reference data block may correspond to image regions (blocks and/or macroblocks) that are above and to the left of an image region represented by the current syntax element.

In some embodiments, the input to the reference data block 420 may, in addition to indicating the type of the current syntax element, also indicate the type and/or attributes of the current macroblock.

The reference data block 420 is operative, in response to the input signal 418 and/or to other information, to select and output reference data from among the data received from the FCD 322 and previously stored in the reference data block 420. This output reference data is indicated at 422 in FIG. 5.

The second circuit branch 414 also includes a bin index counter 424. The bin index counter 424 is operative to output a bin index 426 which is the current value of the counter 424. The counter 424 is coupled to a controller block (not shown) that is part of the context modeler to receive an increment signal in response to the FCD 322 failing to find a matching syntax element with the current bin. The increment signal is also provided to the reference data block 420. The counter 424 is also coupled to the FCD 322 to be selectively reset by the FCD 322 (i.e., to be reset each time the FCD decodes a syntax element).

The second circuit branch 414 may further include an arithmetic logic unit operations block 428. The ALU operations block 428 receives as inputs (a) the input signal 418 which is indicative of the type of the current syntax element, (b) the reference data 422 selected by and output from the reference data block 420, and (c) the bin index 426. The resulting output signal 430 from the ALU operations block 428 is generated in a manner to implement requirements of the AVC-H.264 standard for selection of the appropriate context model for decoding the current bin. The output signal 430 is provided to a context index increment derivation block 432, which is also part of the second circuit branch 414. The context index increment derivation block is also coupled to receive the input signal 418 and is coupled to the bin index counter 424 to receive the bin index 426. Based on these inputs, the context index increment derivation block 432 functions to aggregate operations (such as conditional check or if statement, adds, shifts, assignments) performed by the ALU operations block 428 and to produce as a result the above-mentioned context index increment signal 412. Thus the context index increment derivation block 432 is coupled to the adder 404 to output the context index increment signal 412 as an input to the adder 404.

Although the ALU operations block 428 and the context index increment derivation block 432 are shown separately in FIG. 5, these two blocks may be combined to form a block which derives the context index increment signal based on inputs 418, 422 and 426. Moreover, even if the ALU operations block 428 and the context index increment derivation block 432 are physically laid out as separate blocks, the two may be conceptually regarded as a single block which derives the context index increment signal based on the inputs indicated in the previous sentence.

In any case, the second circuit branch 414 operates to output an increment that is added to the output from the first circuit branch 410 to generate the index signal for the look-up table 402.

The context modeler block 316 also includes a context information update block 434. The context information update block 434 is coupled to the look-up table 402 to update the context information stored in the look-up table 402. The information for updating the look-up table is received by the context information update block 434 from the PBADE 318, which is described in more detail below.

Figure 6:
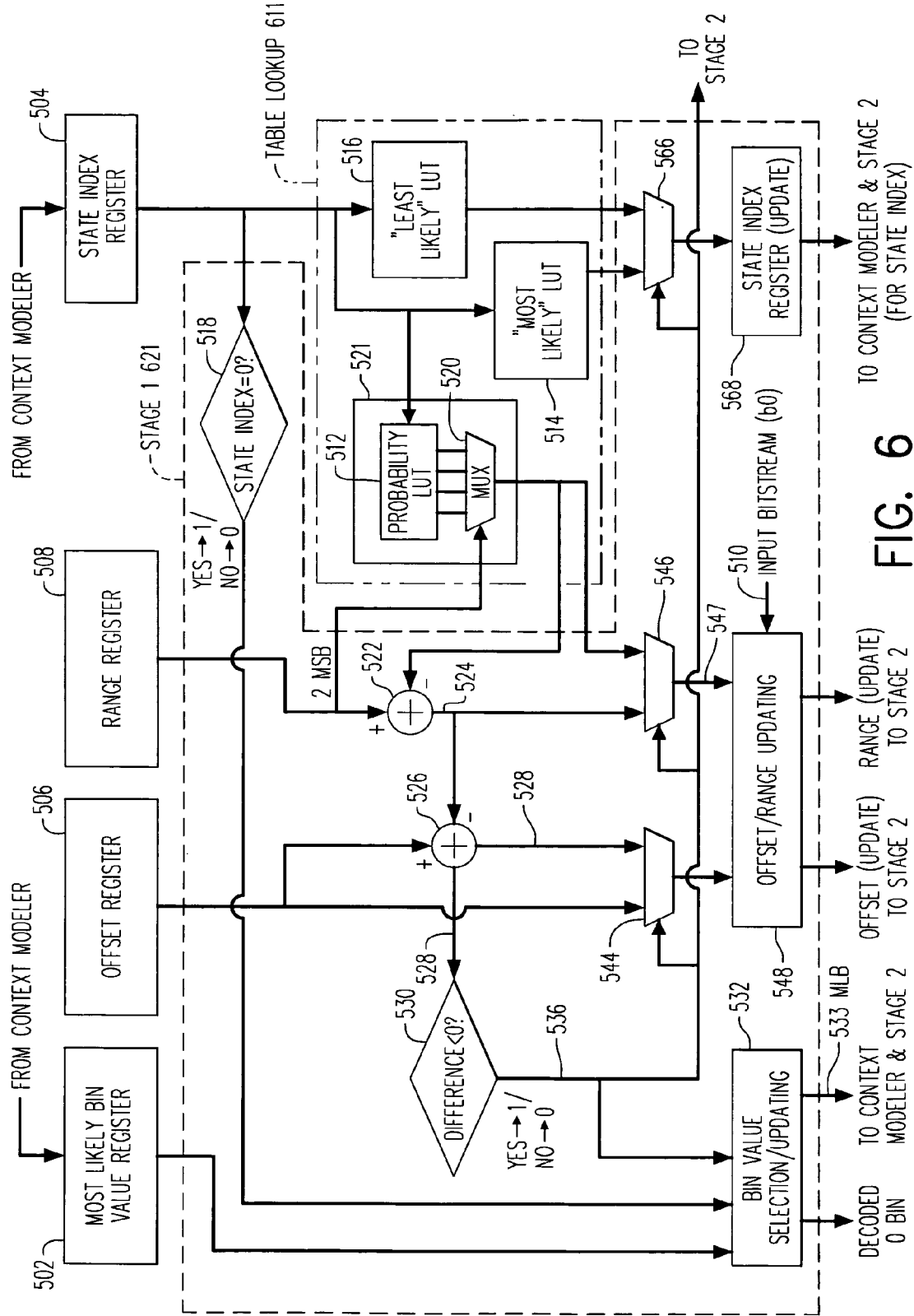
FIG. 6 is a block diagram which shows some details of a parallel binary arithmetic decoder engine (PBADE) that is part of the bitstream parser block of FIG. 3.
Figure 7:
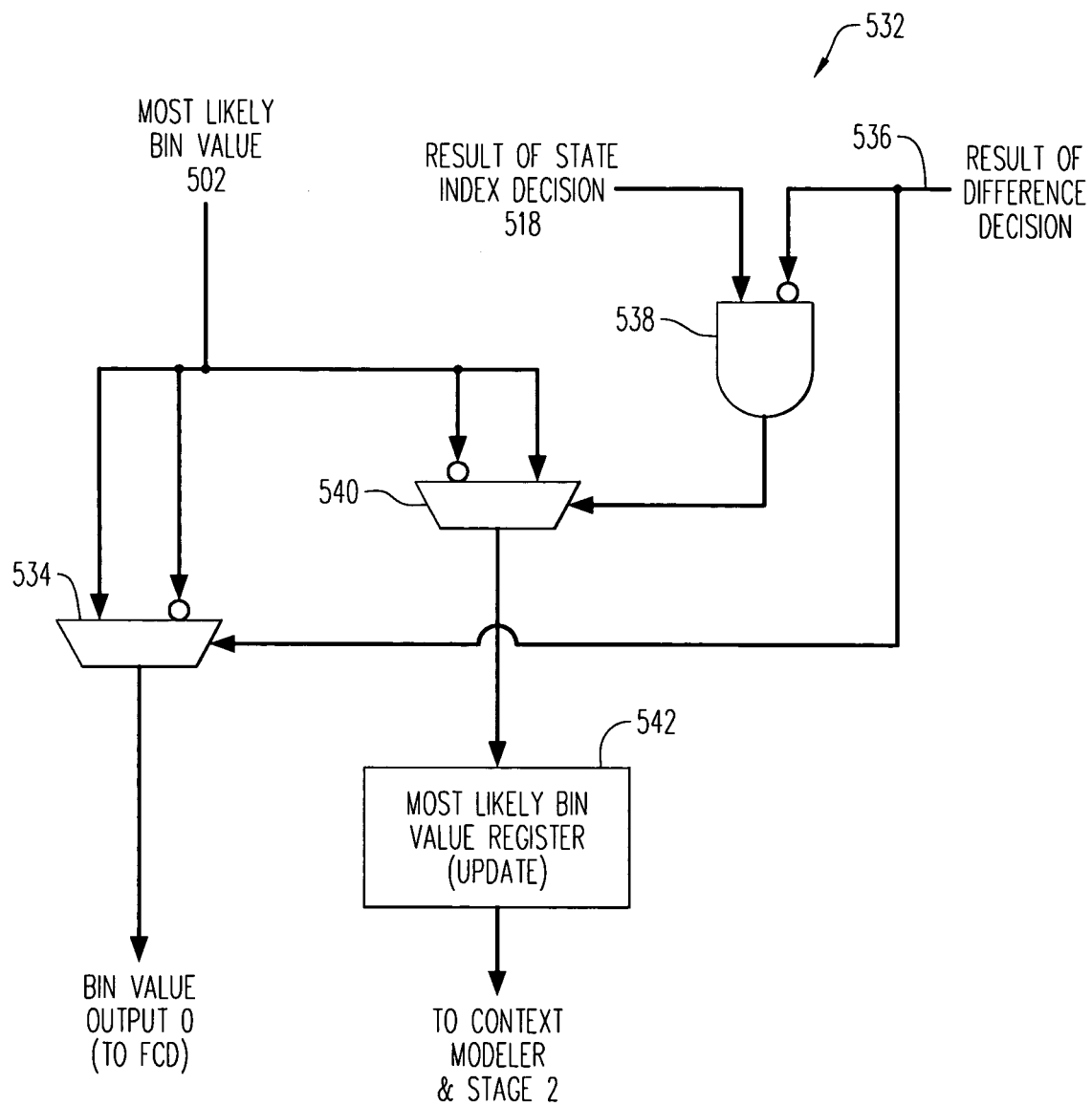
FIGS. 7 and 8 are diagrams which show additional details of the PBADE of FIG. 5.
Figure 8:
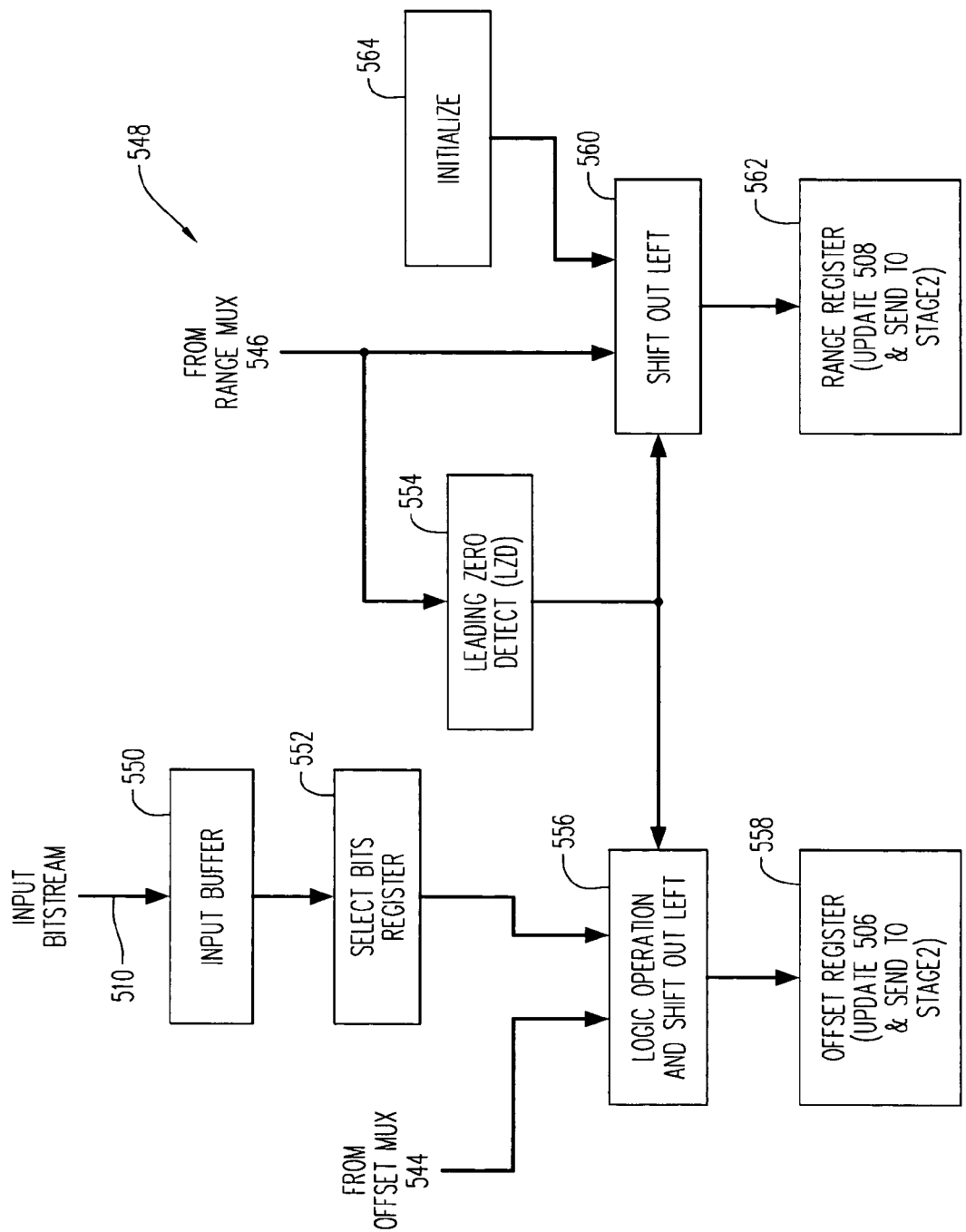

FIG. 6 is a block diagram which shows some details of a single processor element of PBADE 318. FIGS. 7 and 8 are diagrams which show additional details of the single processor element of PBADE 318.

The PBADE 318 includes a most likely bin value register 502. The most likely bin value register 502 receives the most likely bin value output from the look-up table 402 (FIG. 5) of the context modeler block 316 and stores the most likely bin value, which has use in arithmetic coding, as will be detailed below.

The PBADE 318 also includes a state index register 504. The state index register 504 receives the current state index value from the look-up table 402 of the context modeler block 316 and stores the state index value. In other words, this contains the index state ($\alpha$ probability), that an associated context purports to give the odds that the MPS in register 502 is incorrect, and therefore implicitly, that this value is correct.

The PBADE 318 further includes an offset register 506 and a range register 508. The offset register 506 stores a current offset value and the range register 508 stores a current range value. As will be seen, the values stored in the offset register 506 and in the range register 508 are updated from a previous cycle of operation of the PBADE 318. The offset value is derived from the input bitstream (indicated at 510) and parallel stages of bit processing in a manner to be described below, and the range value is derived from a value that is output from a probability look-up table 512, which is in turn indexed by the state index value stored in the state index register 504, as will be detailed below.

Offset register 506 and range register 508 are used in arithmetic coding. In brief, in arithmetic coding, there is determined a likelihood of correctly predicting a given value. For ease of explanation, this likelihood is called a probability. This probability may be the likelihood of picking the MPS, such as shown in FIG. 4 (i.e., each probability state $\alpha$ has its own context that is a probability range for predicting a correct or incorrect value).

In some embodiments, in PBADE 318, an offset is used, which may start at 0. In arithmetic coding, this offset is referred to as a "tag" value. In PBADE 318, if the actual value to be decoded is indeed the MPS (determined by comparing the MPS to the actual value to be decoded), a number that is a function of the probability and the range in range register 508 is added to the offset, as will be described below. In PBADE 318, if the actual bin to be decoded is actually the LPS (after comparing the MPS to the value to be decoded), the offset number in offset register 506 is not changed, but the range in range register 508 is reduced as a function of the LPS and the range in range register 508, as will be described below.

In some embodiments, if the actual value to be decoded is indeed the MPS, the offset value is increased by the percentage chance of the MPS multiplied by the range value, as determined by an $\alpha$ state. If the actual value to be decoded is the MPS, the range value in register 508 is decreased by the percentage chance of the LPS of the $\alpha$ state multiplied by the range value.

In addition to a probability look-up table 512, the PBADE 318 also includes look-up tables 514 and 516. All three of these look-up tables are coupled to the state index register 504 to be indexed by the state index $\alpha$ value stored in the state index register 504. In other words, each LUT 512, 514 and 516 can access the same table showing the contexts, such as shown in FIG. 4.

Turning first to LUT 514 and 516 (which may be referred to as "transition LUTs"), the look-up table 514 is to provide a state index update value in case the most probable symbol (MPS) value is selected in the current cycle. For example, for FIG. 4, if the current context ($\alpha$ state) is state 2, LUT 514 outputs state "3". The look-up table 516 is to provide the state index update value in case the least likely bin value is selected in the current cycle. For example, for FIG. 4, if the current context ($\alpha$ state) is state 2, LUT 516 outputs state "1". The output state chosen is then selected by difference 536 in multiplexer 566, as will be detailed below.

Probability LUT 512 is coupled to a four-input multiplexer 520. Probability LUT 512 outputs a probability value as a function of a state index $\alpha$ received from state index register 504. Both probability LUT 512 and multiplexer 520 are part of a multiplier 521. Each of the inputs of the multiplexer 520 receives a respective one of a group of four outputs from the probability look-up table 512. The multiplexer 520 is coupled to the range register 508 so as to be controlled by the two least significant bits of the range value stored in the range register 508. The value of the two most significant bits (MSB) of the range value selects the degree of precision of the outputs of the probability look-up table 512, which is, in turn, employed by multiplexer 520.

In multiplier 521 two things may occur. First LUT 512 determines the probabilities of the LPS of a given state $\alpha$: four precise probability values—one for each of the four quadrants; these values are input into the multiplexer 520.

Secondly in multiplexer 520, the two most significant bits of the range of 508 are used to select one of those four precomputed quadrant values. The resulting selection at multiplexer 520 has the effect of a multiplication to generate the range of the least probable symbol. The multiplier 521 represents the value of the probability of LPS multiplied by a quadrant of the range value.

For ease of explanation this range of LPS value will be denoted as "rLPS", and the range of MPS value will be denoted by "rMPS". The sum of rLPS and rMPS will equal the range stored in the range register 508.

Figure 9A:
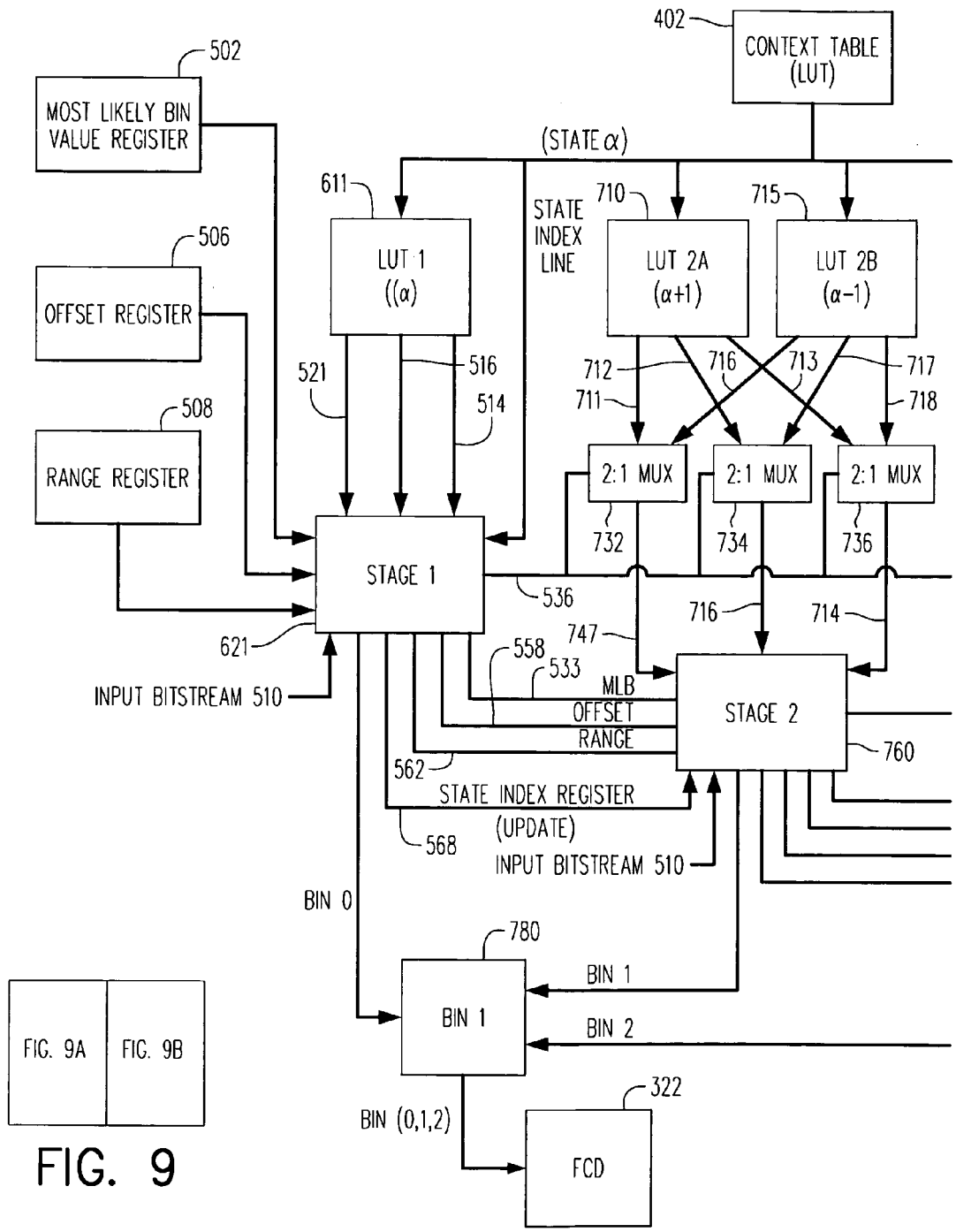
FIG. 9 is a diagram of a decoding circuit that has a plurality of PBADE stages according to some embodiments.

For ease of discussion in FIG. 9 onwards, 514, 516 and 521 are all termed as part of a table lookup 611. For ease of discussion in FIG. 9 onwards, other elements of FIG. 6 are termed as part of stage 1 621.

The PBADE 318 also includes a decision block 518. The decision block 518 is coupled to the state index register 504 to indicate whether the state index a value stored in the state index register 504 is equal to zero. If so, the decision block 518 outputs a "1" value as an output. Otherwise, the decision block 518 outputs a "0" value as an output.

For example, in FIG. 4, if $\alpha$ state equals zero, then 518 outputs the value 1. Otherwise, it outputs the value '0'. This indicates that there is a purported 50% probability of predicting the MPS. Decision block 518 may indicate a trend in the numbers and that the MPS should actually be reversed from what it is at a given point in time.

The PBADE 318 also includes a subtraction block 522. The subtraction block 522 is coupled to the range register 508 and to the output of the multiplier 521. The subtraction block 522 operates to subtract the rLPS value calculated by the multiplier 521 from the range value stored in the range register 508. The result of this subtraction is a difference value indicated at 524. In other words, subtraction block 522 generates as its output the range of the MPS (rMPS), as the range of the LPS has been subtracted from the range value. Both the rMPS and the rLPS are input into multiplexer 546 to be selected at a later time, as will be discussed below.

Further, the PBADE 318 includes a subtraction block 526. The subtraction block 526 is coupled to the offset register 506 and to the output of the subtraction block 522. The subtraction block 526 operates to subtract the difference value output from the subtraction block 522 from the current offset value stored in the offset register 506. The result of the subtraction performed by the subtraction block 526 is a difference value indicated at 528. In other words, the offset value has subtracted from it the rMPS.

The PBADE 318 also includes a decision block 530. The decision block 530 is coupled to the output of the subtraction block 526 to indicate whether the difference value 528 is not less than zero. If the difference value 528 is less than zero, then the decision block 530 provides an output having the value "1". If the difference value 528 is equal to or greater than zero, then the decision block 530 provides an output having the value "0". In other words, the rLPS value is then compared to the offset value. Generally if the offset value is larger than the rLPS, this means that the most likely bin value is the value to be output; otherwise, the least likely bin value is the value to be output.

It is to be understood that the subtraction block 526 and the decision block 530 may be considered to together constitute a compare block that compares the offset value in the offset register 506 with a value derived from the range value in range register 508.

The output of the decision block 530 is provided to a bin value selection and updating block which is indicated at 532 in FIG. 6 and is shown in more detail in FIG. 7. 532 also outputs an updated MPS (533) which is conveyed both to the context modeler (i.e. FIG. 4) and to a stage 2 760 of FIG. 9, as will be detailed below.

Turning briefly to FIG. 7, the bin value selection and updating block 532 is part of the PBADE 318 and includes a multiplexer 534. The multiplexer 534 is coupled to the output 536 in FIG. 6 of the decision block 530 of FIG. 6 so as to be controlled by the output 536. The multiplexer 534 has two inputs, one of which is an inverting input, and both of which are coupled to the most likely bin value register 502 (FIG. 6). Thus the multiplexer 534 selects between the most likely bin value and the inverse of the most likely bin value in response to the value output from the decision block 430. If the value that is output from the decision block 430 is "1", then the multiplexer 534 selects the most likely bin value to be its output value. If the value that is output from the decision block 530 is "0", then the multiplexer 534 selects the inverse of the most likely bin value to be its output value. The output value from the multiplexer 534 is then output from the PBADE 318 to the FCD 322 (FIG. 4) as the current decoded bin value. In some embodiments, the output from multiplexer 534 is one of three or four bins to be decoded in parallel.

Continuing to refer to FIG. 7, the bin value selection and updating block 532 also includes an AND logic gate 538. The AND gate 538 has an inverting input coupled to the output 536 of the decision block 530 (FIG. 5) and a non-inverting input coupled to the output of the decision block 518. The bin value selection and updating block 532 also includes a multiplexer 540. The multiplexer 540 is coupled to the AND gate 538 to be controlled by the output of the AND gate 538. The multiplexer 540 has two inputs, of which one is an inverting input. Both of the inputs of the multiplexer 540 are coupled to the most likely bin value register 502 (FIG. 5). Like the multiplexer 534, the multiplexer 540 selects between the most likely bin value and the inverse of the most likely bin value. The selecting performed by the multiplexer 534 is in response to the output of the AND gate 538.

If the AND gate output is "1" (logical true), then the multiplexer 540 selects the inverse of the most likely bin value to be the output value of the multiplexer 540. If the AND gate output is "0" (logical false), then the multiplexer 540 selects the most likely bin value to be its output value. The output value from the multiplexer 540 is then stored in a most likely bin value update register 542. The most likely bin value update register 542 is part of the bin value selection and updating block 532 and is coupled to the output of the multiplexer 540. From the register 524, the update most likely bin value is output from the PBADE 318 to the context information update block 434 (FIG. 5) of the context modeler block 316 to update the look-up table 402.

The PBADE 318 further includes a multiplexer 544 (FIG. 6) which is coupled to the offset register 506 and to the output of the subtraction block 526. The multiplexer 544 is also coupled to the decision block 530 to be controlled by the output 536 of the decision block 530. Under the control of the output 536, the multiplexer 528 selects between the current offset value stored in the offset register 506 and the difference value 528 that is output from the subtraction block 526. If the output of the decision block 530 is "1", the multiplexer 544 selects the current offset value to be its output value. If the output of the decision block 530 is "0", the multiplexer 544 selects the difference value 528 to be its output value. In other words, if the offset is greater than the offset minus the rLPS, then the offset is selected. If the offset is less than the offset minus the rLPS, then the Offset—LPS is selected.

Turning back to FIG. 6, the PBADE 318 also includes a multiplexer 546. The multiplexer 546 has an input coupled to the subtraction block 522 to receive the difference value 524. The difference value 524 is the rMPS. The other input of the multiplexer 546 is coupled to the output of the multiplexer 520, which is the rLPS. The multiplexer 546 is also coupled to the decision block 530 to be controlled by the output 536 of the decision block 530. Under the control of the output 536, the multiplexer 546 selects between the difference value 524 and the range look-up table value selected by the multiplexer 520. If the output of the decision block 530 is "1", the multiplexer 546 selects the difference value 524 to be its output value. If the output of the decision block 530 is "0", the multiplexer 546 selects the range look-up table value output from the multiplexer 520 to be the output value of the multiplexer 546. In other words, if the offset value is less than or equal to the rMPS, then the rMPS is conveyed as output 547 to offset/range updater 548. If the offset value is greater than the rMPS, then the rLPS is conveyed to offset/range updater 548.

It should be understood that the values input to the multiplexer 544 may be considered "offset update values" in that these values are, or may be used to produce, a value that may be the offset value for a comparison of an offset value versus a least probable range value.

It should also be understood that the values input to the multiplexer 546 may be considered "range update values" in that these values are, or may be used to produce, a value that may be the range value for a comparison of an offset value versus a range value.

The respective output values selected by the multiplexers 544 and 546 are both provided as inputs to an offset and range updating block which is indicated at 548 and which is shown in more detail in FIG. 7. In addition to providing updating functions for the range and offset values compared at the components 526 and 530 (subtraction block and decision block), the offset and range updating block 548 also serves as the point of input for the bitstream 510 that is to be decoded (expanded) into bin values by the PBADE 318. The range value derived in offset/range updating block 548 is then sent both to the context modeler of FIG. 4 and to stage 2, as depicted in FIG. 9. The offset value derived in offset/range updating 548 is then sent to the context modeler of FIG. 4 and to stage 2, as also depicted in FIG. 9.

Referring to FIG. 8, offset/range updating block 548 is described in more detail. The offset and range updating block 548 includes an input buffer 550 that temporarily stores bits from the input bitstream 510. In addition, the offset and range updating block 548 includes a register 552 to select bits for use in an offset updating operation that will be described below.

The offset and range updating block 548 also includes a leading zero detection (LZD) circuit 554. The LZD circuit 554 is coupled to the output of the multiplexer 546 to detect a leading zero-valued bit in the output value from the multiplexer 546. (It is to be understood that the "leading zero-valued bit" is the most significant zero-valued bit in a binary number or sequence of bits.)

Further, the offset and range updating block 548 includes an input shift and logic operation block 556. The input shift and logic operation block 556 is coupled to the LZD circuit 554 to be controlled by the LZD circuit 554. The input shift and logic operation block 556 is also coupled to the output of the multiplexer 544 (FIG. 6) to receive the value output from the multiplexer 544. Still further, the input shift and logic operation block 556 is coupled to the register 552 which selects bits from the input bitstream. Under the control of the LZD circuit 554, the input shift and logic operation block 556 shifts out a number of bits from the input bitstream, with the number of shifted-out bits corresponding to the position of the leading zero-valued bit in the output of the multiplexer 546, as detected by the LZD circuit. As part of the same operation, the input shift and logic operation block 556 applies a logic OR operation to the shifted-out input bits and to bits in the output from the multiplexer. The resulting output from the input shift and logic operation block 556 is used to update the offset register 506 (FIG. 6) for the next operating cycle as indicated at 558 in FIG. 8.

Also, the offset and range updating block 548 includes a range shift block 560. The range shift block 560 is coupled to the LZD circuit 554 to be controlled by the LZD circuit 554. The range shift block 560 also is coupled to the output of the multiplexer 546 (FIG. 5) to receive the value output from the multiplexer 544. Under the control of the LZD circuit 554, the range shift block 560 shifts out a number of bits from the output of the multiplexer 544, with the number of shifted-out bits being the same as the number of input bits shifted out in the current cycle by the input shift and logic operation block 556. The shift block 560 may also perform a logical OR operation and may be padded with "0" bits from the right. The resulting output from the range shift block 560 is used to update the range register 508 (FIG. 6) for the next operating cycle as indicated at 562 in FIG. 8.

The offset and range updating block 548 additionally may include an initializing block 564. The initializing block 564 is coupled to the range shift block 560 to supply a sequence of "0" bits to the range shift block 560 during initialization of the PBADE 318.

The offset and range updating block 548 is operative, under the control of the LZD circuit 554, to perform in one clock cycle a plurality of iterations of the renormalization loop called for by conventional software based AVC-H.264/CABAC decoders. The effective number of iterations of renormalization that are performed in one clock cycle is controlled by the output from the LZD circuit 554.

Referring once more to FIG. 6, the PBADE 318 also includes a multiplexer 566. The multiplexer 566 is coupled to the look-up tables 514, 516 of the look-up table 611 to receive therefrom the values selected therefrom as a function of the state index value stored in the state index register 504. The multiplexer 566 is coupled to the decision block 530 to be controlled by the output 536 of the decision block 530. Under the control of the output 536, the multiplexer 546 selects between the value from the look-up table 514 and the value from the look-up table 516. If the output of the decision block 530 is "1", the multiplexer 566 selects the value from the look-up table 514 to be the output value of the multiplexer 566. If the output of the decision block 530 is "0", the multiplexer selects the value from the look-up table 516 to be the output value of the multiplexer 566.

For example, assuming again that the current $\alpha$ state is 3, either the next most likely context state, such as determined by an $\alpha$ state, 4, is selected from 514, or the next least likely context state, such as $\acute{\alpha}$ state 2 is selected from 516. The next least-likely context state is selected if the offset is greater than the rLPS, and the next most-likely state is selected if the offset is less than the rLPS.

The output value from the multiplexer 566 is then stored in a state index update register 568. The state index update register is part of the PBADE 318 and is coupled to the output of the multiplexer 566. From the register 568, the state index update value is output from the PBADE 318 to the context information update block 434 (FIG. 4) of the context modeler block 316 to update the look-up table 402. State index register 568 is also coupled to stage 2 760, as will be described below.

The architecture of the PBADE 318 as described herein may help optimize output of decoded bins in a small number of clock cycles. The efficient operation of the PBADE is promoted by the operation of the offset and range updating block 548 to perform several stages of renormalization in a single cycle, and also by the parallel control of several multiplexers by the single decision block 530.

Although not shown in the drawings, the context modeler and the PBADE may contain circuitry to respond to a "bypass flag". The bypass flag may appear in the input bitstream to indicate that a very low probability syntax element is being transmitted without arithmetic coding. The bypass flag triggers a bypass mode in the BSP so that, for example, the look up tables 512, 514, 516 are not accessed and blocks 502 and 504 are idle.

Turning now to FIG. 9, illustrated is a parallel CABAC decoder 700 according to some embodiments. The most likely bin value register 502, the offset register 506 and the range register 508 are coupled into stage 1 621 of FIG. 6. Also, LUT 1 611 is also coupled into stage 1. Context table 402 is also coupled to LUT 611. The output of LUT 611, which are the outputs of 516 (next 'n' least likely state), 514, (next 'n' most likely state) and an output of multiplier 521 are coupled into stage 1 621. A state index line is also coupled from context table 402 to state index decision block 518 of FIG. 6. For ease of explanation, the output of an element of the present disclosure, such as LUT 514, may also be referenced as 514 as well.

Context table 402 is also coupled to a LUT 2A 710 and a LUT 2B 715. Each of the LUTs 710 and 715 have three outputs, 711-713 and 716-718, respectively. Each of these outputs is analogous to the outputs 521, and the output of LUTs 514, 516, of multiplier 521, but for a next more or less likely state, (n+1) as will be described below. Furthermore, in some embodiments, the order of outputs may be rearranged. In some embodiments, the least likely state is the first output, the most likely state is the second output, and the range of the least likely state is the third output.

In LUT 2A 710, for a given $\acute{\alpha}$ state from context table 402, LUT 2A 710 receives the $\acute{\alpha}$ state received from context modeler 402, looks at the $\acute{\alpha}+1$ state and outputs a value as a function of the $\acute{\alpha}+1$ state. For example, if the $\acute{\alpha}$ state received from the context modeler is 3, according to FIG. 4, the $\acute{\alpha}+1$ state is 4. Therefore, a next least likely state 711, a next most likely state 712, and a range of the least likely value 713 for the $\acute{\alpha}+1$ state (i.e. state 4) is transmitted from 710 over 711-713, respectively.

For example, if $\acute{\alpha}$ of context modeler 402 $\acute{\alpha}=3$, the LUT 2A ($\acute{\alpha}+1$) 710 value becomes $\acute{\alpha}=4$. Therefore, the MPS output $\acute{\alpha}+1$ (6=5) is output to MUX 732 over 711, the $\acute{\alpha}-1$ LPS stage ($\acute{\alpha}=3$) is output to a MUX 734 over 712, and the range of the LPS of ($\acute{\alpha}+1$, i.e., $\acute{\alpha}$ state 4) percentage LPS (12%) is conveyed to a MUX 736 over 713.

In LUT 2B 715, for a given $\acute{\alpha}$ state from context table 402, LUT 2B 715 looks at the $\acute{\alpha}-1$ state and outputs values as a function of the $\acute{\alpha}-1$ state. For example, if $\acute{\alpha}$ state is 3, according to FIG. 4, the $\acute{\alpha}-1$ state is 2. Therefore, a next least likely state 716, a next most likely state 717, and a range of the least likely value for the $\acute{\alpha}-1$ state (i.e. state 2) 718 is transmitted from 715 over 716-718, respectively.

For example, if $\acute{\alpha}$ of context modeler 402 $\acute{\alpha}=3$, the LUT 2A ($\acute{\alpha}-1$) 715 value becomes $\acute{\alpha}=2$. Therefore, the MPS output $\acute{\alpha}+1$ ($\acute{\alpha}=3$) is output to MUX 732 over 716, the $\acute{\alpha}-1$ LPS stage ($\alpha 6=3$) is output to a MUX 732 over 717, and the range of the LPS of ($\acute{\alpha}-1$, i.e., $\acute{\alpha}$ state 2) percentage LPS (30%) is conveyed to a MUX 736.

Each of MUX 732 (representing a choice between MPSs for the $\acute{\alpha}+1$ and the $\acute{\alpha}-1$ states), MUX 734 (representing a choice between different LPS for the $\acute{\alpha}+1$ and the $\acute{\alpha}-1$ states), and MUX 736 (representing a choice between different percentages for the $\acute{\alpha}+1$ and the $\acute{\alpha}-1$ states) is controlled as a function of output 536 from stage 1 621, and these values, the selected rLPS for the next highest context state, or the selected rLPS for the next lowest context state, are then conveyed to stage 2 760, as will be described in more detail regarding FIG. 10.

For stage 2 760, as will be described later, instead of receiving 502, 504, 506, 508, etc. from context modeler 402, the MPS value, the offset (i.e., the tag), and the range are received from stage 1 as MPS 533, offset 558 and range 562. Also, the state index register 568 of stage 1 611 is used by a difference engine of stage 2.

Then, in MUXes 732, 734, and 736, either the LUT 2A ($\acute{\alpha}+1$) 710 outputs are selected, or the LUT 2B ($\acute{\alpha}-1$) 715 outputs are selected, as a function of the output 536 of stage 1. LUT 2A ($\acute{\alpha}+1$) 710 is selected if output 536 is "1", and LUT 2B ($\acute{\alpha}-1$) 715 is selected if output 536 is "0". Thus the appropriate state for stage 2 is selected based on the current bin value output by stage 1. Then, whichever output (i.e., of 710 or 715) is selected, this selected output is then convey as rangeLPS(n+1), the most likely $\acute{\alpha}$ state for (n+1) and the least likely $\acute{\alpha}$ state for (n+1).

In stage 2 760, inputs 716 and 714 are received as a function of output 536. These represent the next least likely transition, (714) the next most likely transition (716), for either the ($\acute{\alpha}-1$) state or the ($\acute{\alpha}+1$), and the range of the least likely range (747) of either the ($\acute{\alpha}+1$) state as selected by output 536. Furthermore, updated state index 562 is also conveyed to stage 2 760. Then, processing occurs in stage 2 760 that generates a second output 836, which is conveyed to stage 3. Also, a binary bin 1 output is generated by stage 2 760, which is conveyed to a combiner 780. Stage 2 760 also generates a MPS(n+2) 752, an offset (n+2) 754, a range(n+2) 756, and a state index (i.e. $\acute{\alpha}$ state for n+1). The output 836 is also output to MUXes 784, 786, 787 which are in turn coupled to stage 3. In some embodiments, from stage 2 760, a second of three bins is decoded as bin 1. Stage 3 770 is coupled to stage 2 760.

Context table 402 is also coupled to a LUT 3A 720, a LUT 3B 722, a LUT 3C 824, and a LUT 3D 826. For ease of explanation, LUT 3A 720, a LUT 3B 722 are designated as belonging to first group 719, and LUT 3C 824, and LUT 3D 826 are designated as belonging to a second group 723.

Each of the LUT 3A 720, a LUT 3B 722, a LUT 3C 824, and LUT 3D 826 have three outputs. LUT 3A 720 has outputs 781-783; LUT 3B 722 has outputs 784-786; LUT 3C 824 has outputs 787-789; and LUT 3D 826 has outputs 790-792. Each of the LUTs 3A, 3B, 3C and 3D may have substantially the same structure as the LUTs 611, 710, 715 in that each includes a respective "most likely" LUT, a respective "least likely" LUT, a respective range/probability LUT and a respective merge (as in 710, 715; not 611) coupled to the respective range/probability LUT.

In LUT 3A 720, for a given $\acute{\alpha}$ state from context table 402, LUT 3A 720 receives the $\acute{\alpha}$ state received from context modeler 402, determines the $\acute{\alpha}+1+1$ state and outputs values as a function of the $\acute{\alpha}+1+1$ state. For example, if the $\acute{\alpha}$ state received from the context modeler is 3, according to FIG. 4, the $\acute{\alpha}+1+1$ state is 5. Therefore, a next least likely state 781 ($\acute{\alpha}=4$), a next most likely state 782 ($\acute{\alpha}=6$), and a range of the least likely value for the $\acute{\alpha}+1+1$ state (i.e. state 5) is transmitted from 720 over 781-783, respectively.

In LUT 3B 722, for a given $\acute{\alpha}$ state from context table 402, LUT 3B 722 determines the $\acute{\alpha}+1-1$ state and outputs values as a function of the $\acute{\alpha}+1-1$ state. For example, if $\acute{\alpha}$ state is 3, according to FIG. 4, the $\acute{\alpha}+1-1$ state is 3. Therefore, a next least likely state 781 ($\acute{\alpha}=2$), a next most likely state 782 ( $\acute{\alpha}=4$), and a range of the least likely value for the $\acute{\alpha}+1-1$ state (i.e. state 3) is transmitted from 720 over 784-786, respectively.

In LUT 3C 824, for a given $\acute{\alpha}$ state from context table 402, LUT 3C 824 receives the $\acute{\alpha}$ state received from context modeler 402, determines the $\acute{\alpha}-1+1$ state and outputs values as a function of the $\acute{\alpha}-1+1$ state. For example, if the $\acute{\alpha}$ state received from the context modeler is 3, according to FIG. 4, the $\acute{\alpha}-1+1$ state is 3. Therefore, a next least likely state 787 ($\acute{\alpha}=2$), a next most likely state 788 ($\acute{\alpha}=6$), and a range of the least likely value for the $\acute{\alpha}-1+1$ state (i.e. state 3) is transmitted from LUT 3C 824 over 787-789, respectively.

In LUT 3D 826, for a given $\acute{\alpha}$ state from context table 402, LUT 3D 826 receives the $\acute{\alpha}$ state received from context modeler 402, determines the $\acute{\alpha}-1-1$ state and outputs values as a function of the $\acute{\alpha}-1-1$ state. For example, if the $\acute{\alpha}$ state received from the context modeler is 3, according to FIG. 4, the $\acute{\alpha}-1-1$ state is 1. Therefore, a next least likely state 787 ($\acute{\alpha}=1$), a next most likely state 788 ($\acute{\alpha}=2$), and a range of the least likely value for the $\acute{\alpha}$-1-1 state (i.e. state 1) is transmitted from 726 over 790-792, respectively.

Inputs 781 and 784 are input into MUX 740. Inputs 782 and 785 are input into MUX 741. Inputs 783 and 786 are input into MUX 743. MUXes 740, 741 and 743 belong to group 1 719.

Inputs 787 and 790 are input into a MUX 745. Inputs 788 and 791 are input into a MUX 747. Inputs 789 and 792 are input into a MUX 749. MUXes 745, 747 and 749 belong to group 2 723.

An output of each MUX of both groups 719 and 723 is selected by output 536. If output 536 is "1", then the outputs of tables 720 and 824 are selected. If output 536 is "0", then the outputs of tables 722 and 826 are selected. As in the case of stage 2, the appropriate state for stage 3 is being selected based in part on the current bin value output by stage 1.

The outputs of group 1 719 (771, 772, 773) and the outputs of group 2 723 (774, 775, and 776) are then input into MUXes 751, 753, and 755, respectively. Then, either group 1 719 and group 2 723 are then selected by an output 836 of stage 2. Difference output 836 will be described in more detail in relation to FIG. 10. The selected group (i.e. group 1 719 or group 2 723) are then conveyed to stage 3 770 as inputs 797, 798, and 799, respectively.

Similarly, for stage 3 770, instead of receiving 502, 506, 508, etc. from context modeler 402, the MPS (or MLB), offset (i.e., the tag), and the range are received from stage 2 for the next selected state (i.e. either $\acute{\alpha}$+1 state, or the $\alpha$-1 state, as selected by output 536) as the MPS (or MLB) 752, offset 754 and range 756. Also, the state index register of stage 2 760 is used by a difference engine of stage 3. In some embodiments, from stage 3 770, a third of three bins is decoded as bin 2.

It is to be understood that, in some embodiments, the ($\acute{\alpha}$+1-1) state may not necessary be equal to $\acute{\alpha}$. For example, in FIG. 4, state 6 transitions to state 7, ($\acute{\alpha}$+1), as the most likely state. Then, for LUT 3B 722, the $\acute{\alpha}$ state transitions from the present context 7 to the LPS, which is context state 5.

Generally, in the parallel CABAC decoder 700, in some embodiments, use of the $\acute{\alpha}$+1 and the $\acute{\alpha}$-1 may allow for substantially parallel processing and decoding of the offset, range, a state, MSB, and so on for multiple bins.

Turning now to FIG. 10, illustrated is stage 2 760 and coupled circuitry of FIG. 9 according to some embodiments. Stage 2 760 may have a LUT 2A 710, a LUT 2B 715. Outputs of these are input into MUXes 732, 734, and 736. In some embodiments, range 562 is used to select an output of MUX 827. Each of the outputs of MUXes 732, 734, and 736, selected by output 536, is then input into Stage 2 760. LUT 2A 710 has a range LUT ($\acute{\alpha}$+1) 805 and a coupled merge 803. LUT 2A 710 also has a most likely LUT 808 and a least likely LUT 807. The outputs of these are coupled to MUXes 732-736, respectively.

Each of the inputs of the merge 803 receives a respective one of a group of four outputs from the probability look-up table 805. The particular group of four outputs is selected by the current state index value stored in the state index register 568, so that the state index value acts as an index for the probability LUT 805. The particular group of four outputs is selected from among a number of groups of four precision values stored in the probability LUT 803.

In some embodiments, LUT 2A 710 may work as follows. An $\acute{\alpha}$ state is received at least likely LUT 807 and most likely LUT 808. Each of these LUT tables then advances to the $\acute{\alpha}$+1 state. Then, each table LUT 807 and 808 then looks up the next most and least likely transition for that $\acute{\alpha}$ state. For instance, if the $\acute{\alpha}$ state received from stage 1 is 3, then least likely 807 and most likely 808 is determined for the $\acute{\alpha}$+1 state, e.g., state 2, 4, and these values are transferred to MUXes 734 and 736, respectively.

In some embodiments, LUT 2A 710 may work as follows. Probability LUT 805 indexes the probability for an ($\acute{\alpha}$+1) state (e.g. 40% chance of least likely transition). Then, this percentage is conveyed to a merge 803 and ultimately, in a suitable case, to MUX 827 via MUX 732. At MUX 827, the probability is then multiplied by range register 562, thereby yielding a range value of the least likely probability for a next state for ($\acute{\alpha}$+1). This value is then conveyed to MUX 732. Note that this value, in some embodiments, may have a plurality of outputs of differing precision. For ease of explanation, probability LUT 805 and merge 803 are referred to as a multiplier 821.

LUT 2B 715 has a probability LUT ($\acute{\alpha}$-1) 815 and a coupled merge 813, which, with MUX 732 function as a multiplier 823. LUT 2b 715 also has a least likely LUT 807 and most likely LUT 809. The outputs of these are coupled to MUXes 732-734, respectively.

In some embodiments, LUT 2B 715 may work as follows. An $\acute{\alpha}$ state is received at least likely LUT 817 and most likely LUT 818. Each of these LUT tables then advances to the $\acute{\alpha}$-1 state. Then, each table LUT 817 and 818 then looks up the next most and least likely transition for that $\acute{\alpha}$-1 state. For instance, if the $\acute{\alpha}$ state received from stage 1 is 3, then least likely 807 and most likely 808 is determined for the $\acute{\alpha}$-1 state, e.g., state 2, and these values are transferred to MUXes 734 and 736 (i.e., the $\acute{\alpha}$ state 1 and the $\acute{\alpha}$ state 3).

In some embodiments, LUT 2B 715 may work as follows. Range LUT 815 indexes the probability for an ($\acute{\alpha}$-1) state (e.g. 40% chance of least likely transition). Then, this percentage is conveyed to a merge 813 and then to MUX 827 (in suitable cases) via MUX 732. At the MUX 827, the probability is then multiplied by range register 562, thereby yielding a range value of the least likely probability for a next state for ($\acute{\alpha}$-1). This value is then conveyed to MUX 866.

The outputs of MUXes 732, 734, 736 are then selected by output 536. If the output is a 1, the values of LUT 2A 710 are selected. If the output is a 0, the values of LUT 2B 715 are selected.

Figure 10B:
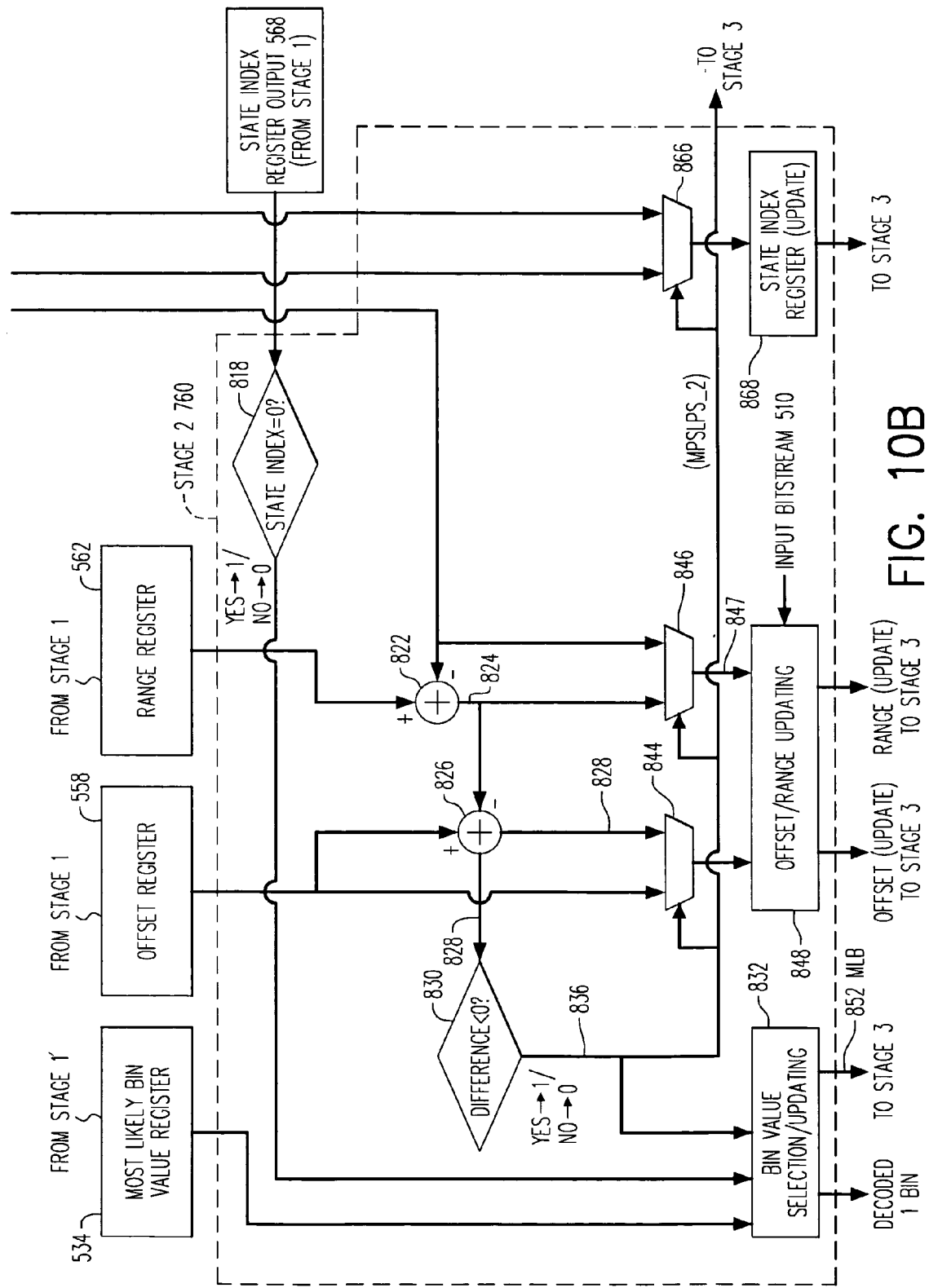
FIG. 10 is a diagram showing some details of the decoding circuit of FIG. 9.
Figure 11:
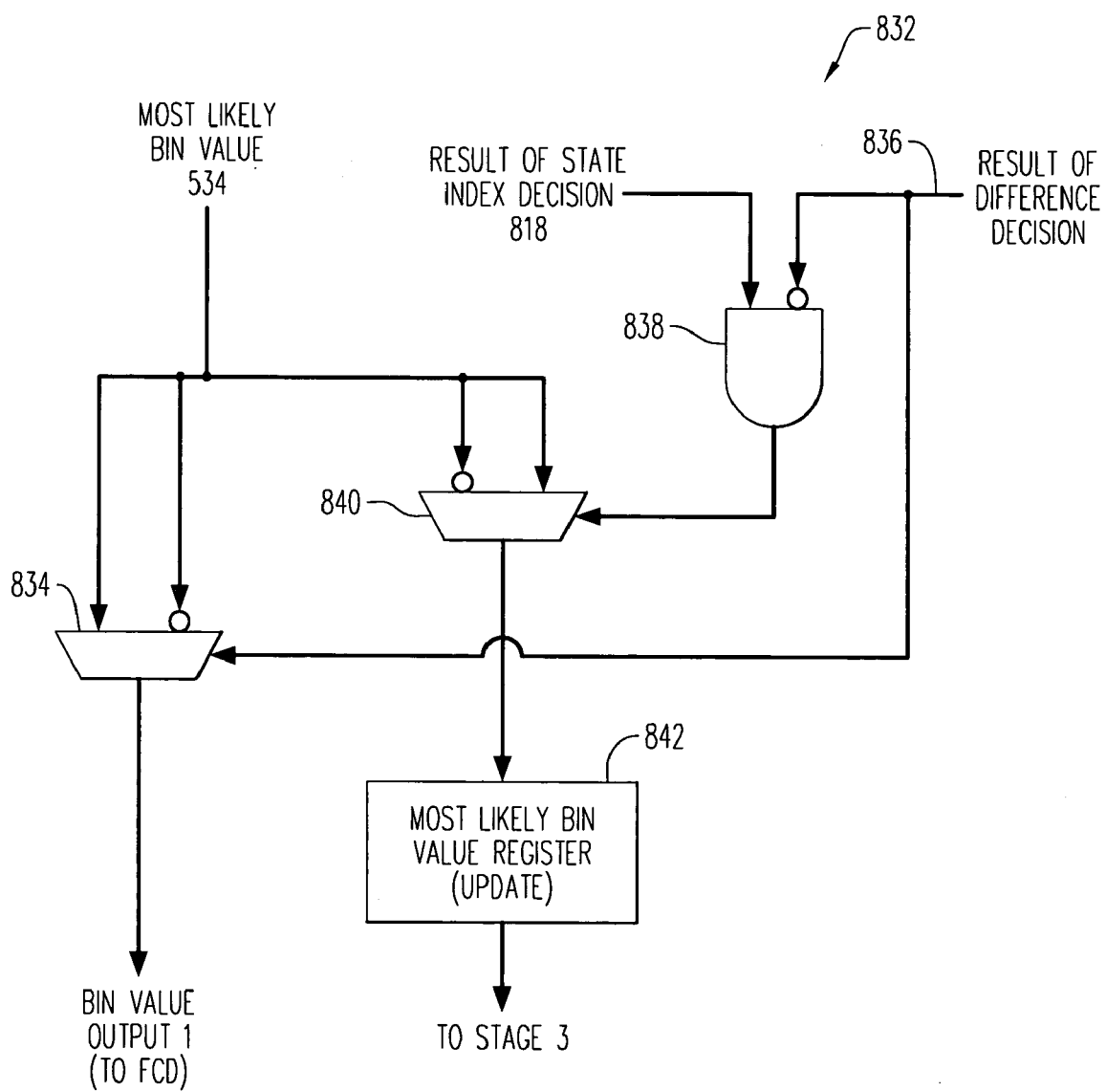
FIGS. 11 and 12 are diagrams which show additional details of the circuitry shown in FIG. 10B.
Figure 12:
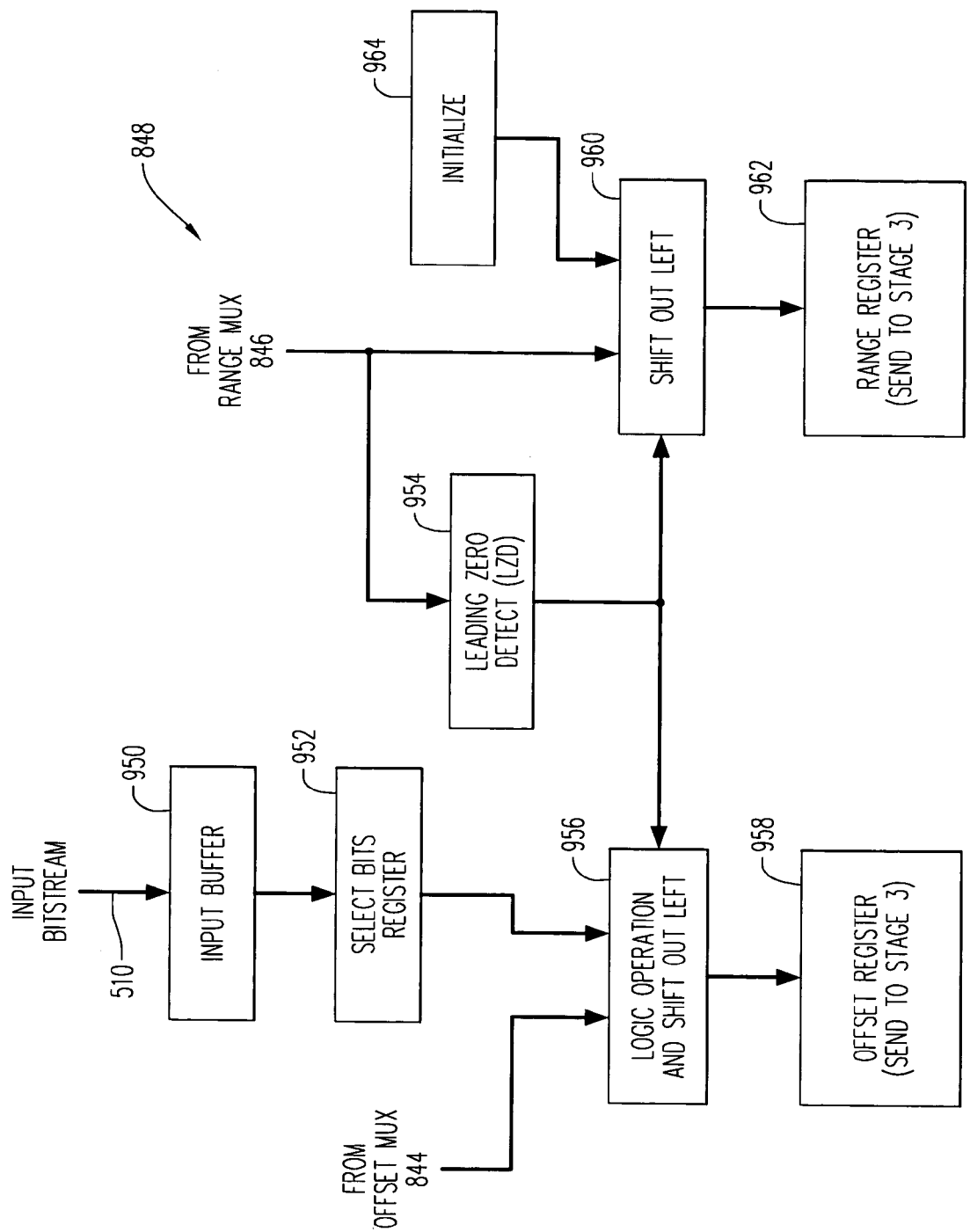

FIG. 10 further includes stage 2 760. Generally, in some embodiments, Stage 2 760 may work in a similar fashion as stage 1 621, and will be described in brief below, with emphasis upon its relationship to stage 1 621 and stage 3 770. Outputs of stage 2 621 are conveyed to stage 3 770. FIGS. 11 and 12 are diagrams which show additional details of the stage 2 760. Bin 1 is output to bin 1 780 (FIG. 9A), which is in turn conveyed to FCD 322.

The stage 2 760 has associated therewith a most likely bin value register 534. The most likely bin value register 534 receives the most likely bin value output from MLB 533 of stage 1.

The stage 2 760 also has associated therewith a state index register 568. The state index register 568 receives the current state index value from state index register 568 of stage 1 621 and stores this state index value.

The stage 2 760 further has associated therewith an offset register 558 and a range register 562. The offset register 558 stores the offset value (i.e., a 'tag') from offset/range updater 548 and the range register 562 stores a range value. The offset value is derived from the input bit-stream (indicated at 510) in a manner to be described below, and the range value is derived from a value that is selected from the output of multiplier 821 or 823 by decision 536, which is indexed by the state index value stored in the state index register 568.

The stage 2 760 also includes a decision block 818. The decision block 818 is coupled to the state index register output 568. If the decision block 818 indicates that the state index is zero, the decision block 818 outputs a "1" value as an output. Otherwise, the decision block 818 outputs a "0" value as an output.

The stage 2 760 also includes a subtraction block 822. The subtraction block 822 is coupled to the range register 862 and to the output of the 4:1 MUX 827. The subtraction block 822 operates to subtract the rLPS value selected by the MUX 827 from the range value stored in the range register 562. The result of this subtraction is a difference value indicated at 824. In other words, subtraction block 822 generates as its output the range of the MPS (rMPS), as the range of the LPS has been subtracted from the range value. Both the rMPS and the rLPS are input into MUX 846 to be selected at a later time, as will be discussed below.

Further, the stage 2 760 includes a subtraction block 826. The subtraction block 826 is coupled to the offset register 558 and to the output of the subtraction block 822. The result of the subtraction performed by the subtraction block 826 is a difference value indicated at 828. In other words, the offset value has subtracted from it the rMPS.

The stage 2 760 also includes a decision block 830. The decision block 830 is coupled to the output of the subtraction block 586 to indicate whether the difference value 828 is not less than zero. If the difference value 828 is less than or equal to zero, then the decision block 530 provides an output having the value "1". If the difference value 828 is greater than zero, then the decision block 530 provides an output having the value "0". In other words, the rLPS value is then compared to the offset value. Generally if the offset value is larger than the rLPS, this means that the most likely bin value is the value to be output; otherwise, the least likely bin value is the value to be output. Furthermore, the output 836 is conveyed to stage 3 770 (FIG. 9B).

It is to be understood that the subtraction block 826 and the decision block 830 may be considered to together constitute a compare block that compares the offset value in the offset register 558 with a value derived from the range value in range register 562.

Figure 9B:
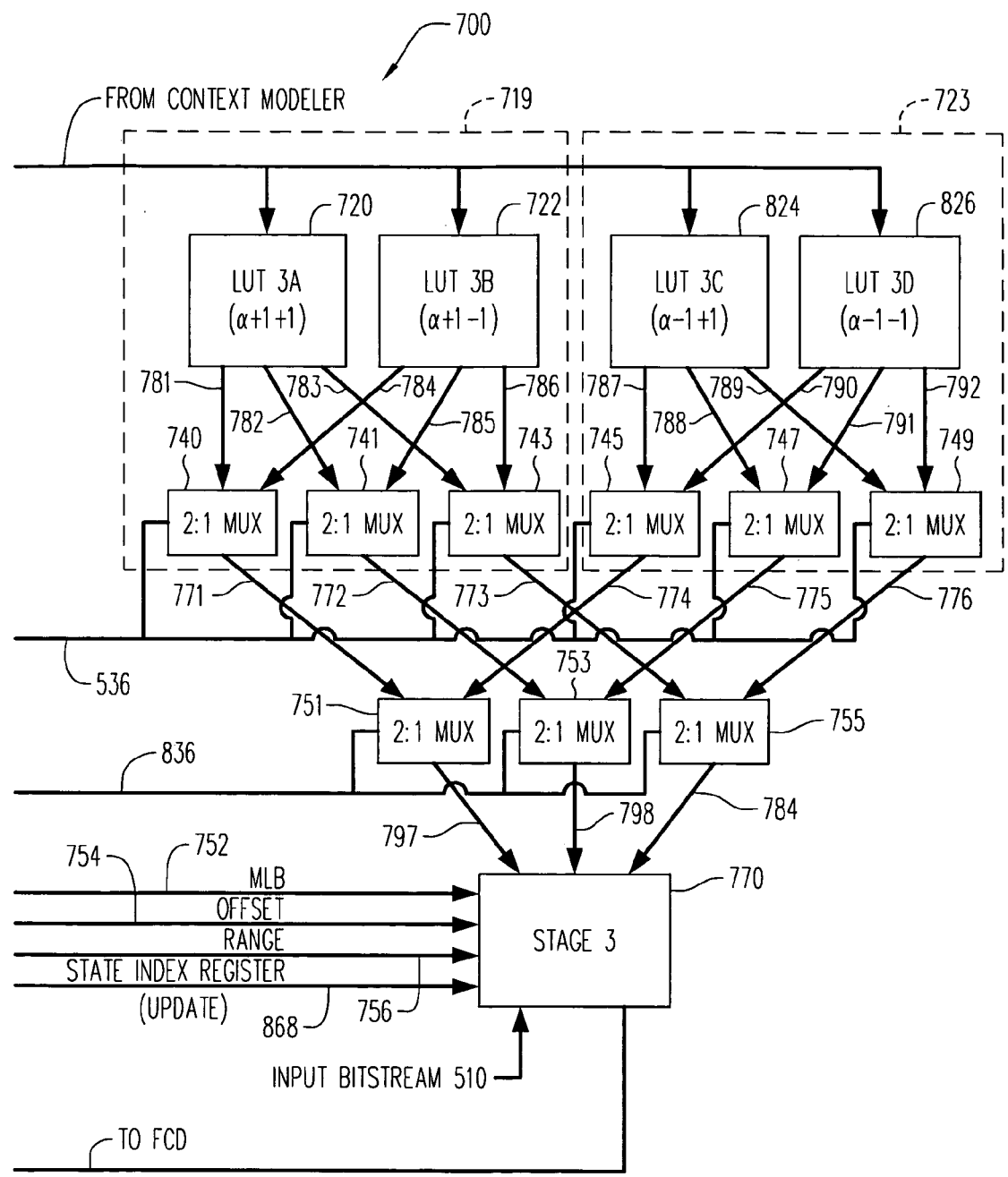

The output of the decision block 830 is provided to a bin value selection and updating block which is indicated at 832 in FIG. 10 and is shown in more detail in FIG. 11. 832 also outputs an updated MPS (833) which is conveyed both to the context modeler (i.e. FIG. 4) and to stage 3 770 of FIG. 9B.

In FIG. 11, the multiplexer 834 is coupled to the output (indicated at 836 in FIGS. 10 and 11) of the decision block 830 (FIG. 10) so as to be controlled by the output 836. The multiplexer 834 has two inputs, one of which is an inverting input, and both of which are coupled to the most likely bin value register 534 (FIG. 10). Thus the multiplexer 834 selects between the most likely bin value and the inverse of the most likely bin value in response to the value output from the decision block 830. If the value that is output from the decision block 830 is "1", then the multiplexer 834 selects the most likely bin value to be its output value. If the value that is output from the decision block 830 is "0", then the multiplexer 534 selects the inverse of the most likely bin value to be its output value. The output value from the multiplexer 834 is then output from the stage 2 760 to the FCD 322 (FIG. 3) as the decoded bin 1 value.

Continuing to refer to FIG. 11, the bin value selection and updating block 832 also includes an AND logic gate 838. The AND gate 838 has an inverting input coupled to the output 836 of the decision block 830 (FIG. 10) and a non-inverting input coupled to the output of the decision block 818.

The bin value selection and updating block 832 also includes a multiplexer 840. The multiplexer 840 is coupled to the AND gate 838 to be controlled by the output of the AND gate 838. The multiplexer 840 has two inputs, of which one is an inverting input. Both of the inputs of the multiplexer 840 are coupled to the most likely bin value register 534 (FIG. 10). Like the multiplexer 834, the multiplexer 840 selects between the most likely bin value and the inverse of the most likely bin value. The selecting performed by the multiplexer 834 is in response to the output of the AND gate 838. If the AND gate output is "1" (logical true), then the multiplexer 840 selects the inverse of the most likely bin value to be the output value of the multiplexer 840. If the AND gate output is "0" (logical false), then the multiplexer 840 selects the most likely bin value to be its output value. The output value from the multiplexer 580 is then stored in a most likely bin value update register 842 and output as MLB 852 to stage 3 770. The most likely bin value update register 842 is part of the bin value selection and updating block 832 and is coupled to the output of the multiplexer 840.

Turning back to FIG. 10, the stage 2 760 further includes a multiplexer 844 which is coupled to the offset register 558 and to the output of the subtraction block 826. The multiplexer 844 is also coupled to the decision block 830 to be controlled by the output 836 of the decision block 830. Under the control of the output 836, the multiplexer 844 selects between the current offset value stored in the offset register 558 and the difference value 828 that is output from the subtraction block 826. If the output of the decision block 830 is "1", the multiplexer 844 selects the current offset value (i.e., the 'tag' value) to be its output value. If the output of the decision block 830 is "0", the multiplexer 844 selects the difference value 828 to be its output value.

The stage 2 760 also includes a multiplexer 846. The multiplexer 846 has an input coupled to the subtraction block 822 to receive the difference value 824 (i.e., the range of the most likely value). The other input of the multiplexer 846 is coupled to the output of the multiplexer 827. The multiplexer 846 is also coupled to the decision block 830 to be controlled by the output 836 of the decision block 830. Under the control of the output 836, the multiplexer 846 selects between the difference value 824 (i.e., the range of the most likely value) and the range look-up table value (i.e., the range of the least likely outcome) selected by the multiplexer 827. If the output of the decision block 830 is "1", the multiplexer 846 selects the difference value 824 to be its output value. If the output of the decision block 830 is "0", the multiplexer 846 selects the range look-up table value output from the multiplexer 827 to be the output value of the multiplexer 846.

The respective output values selected by the multiplexers 844 and 846 are both provided as inputs to an offset and range updating block which is indicated at 848 and which is shown in more detail in FIG. 12. In addition to providing updating functions for the range and offset values compared at the components 826 and 830 (subtraction block and decision block), the offset and range updating block 848 also serves as the point of input for the bitstream 510 that is to be decoded (expanded) into bin values by the stage 2 760.

Referring to FIG. 12, the offset and range updating block 848 includes an input buffer 950 that temporarily stores bits from the input bitstream 510. In addition, the offset and range updating block 848 includes a register 952 to select bits for use in an offset updating operation that will be described below.

The offset and range updating block 848 also includes a leading zero detection (LZD) circuit 954. The LZD circuit 954 is coupled to the output of the multiplexer 946 to detect a leading zero-valued bit in the output value from the multiplexer 946. (It is to be understood that the "leading zero-valued bit" is the most significant zero-valued bit in a binary number or sequence of bits.)

Further, the offset and range updating block 548 includes an input shift and logic operation block 956. The input shift and logic operation block 956 is coupled to the LZD circuit 954 to be controlled by the LZD circuit 954. The input shift and logic operation block 956 is also coupled to the output of the multiplexer 844 (FIG. 10) to receive the value output from the multiplexer 844. Still further, the input shift and logic operation block 956 is coupled to the register 952 which selects bits from the input bit-stream. Under the control of the LZD circuit 954, the input shift and logic operation block 956 shifts out a number of bits from the input bit-stream, with the number of shifted-out bits corresponding to the position of the leading zero-valued bit in the output of the multiplexer 946, as detected by the LZD circuit. As part of the same operation, the input shift and logic operation block 956 applies a logic OR operation to the shifted-out input bits and to bits in the output from the multiplexer. The resulting output from the input shift and logic operation block 956 is used to update the offset register 754 (FIG. 9) for use by stage 3 770.

Also, the offset and range updating block 848 includes a range shift block 960. The range shift block 960 is coupled to the LZD circuit 954 to be controlled by the LZD circuit 954. The range shift block 960 also is coupled to the output of the multiplexer 846 (FIG. 5) to receive the value output from the multiplexer 846. Under the control of the LZD circuit 954, the range shift block 960 shifts out a number of bits from the output of the multiplexer 846, with the number of shifted-out bits being the same as the number of input bits shifted out in the current cycle by the input shift and logic operation block 956. The shift block 960 may also perform a logical OR operation and may be padded with "0" bits from the right. The resulting output from the range shift block 960 is used to update the range register 756 (FIG. 9) for use by stage 3 770.

The offset and range updating block 848 additionally may include an initializing block 964. The initializing block 964 is coupled to the range shift block 960 to supply a sequence of "0" bits to the range shift block 960 during initialization of the stage 2 760.

The offset and range updating block 848 is operative, under the control of the LZD circuit 954, to perform in one clock cycle a plurality of iterations of the renormalization loop called for by conventional software based AVC-H.264/CABAC decoders. The effective number of iterations of renormalization that are performed in one clock cycle is controlled by the output from the LZD circuit 954.

Referring once more to FIG. 10, the stage 2 760 also includes a multiplexer 866. The multiplexer 866 is coupled to the MUXes 734 and 736 to receive therefrom, the values selected therefrom by the state index value selected by output 536. The multiplexer 866 is coupled to the decision block 830 to be controlled by the output 536 of the decision block 530 of stage 1 621. Under the control of the output 536, the multiplexer 846 selects between the value from the MUX 734 (the most likely LUT) and the value from the MUX 736 (the least likely LUT). If the output of the decision block 530 is "1", the multiplexer 866 selects the value from the MUX 734 to be the output value of the multiplexer 866. If the output of the decision block 830 is "0", the multiplexer selects the value from MUX 736 to be the output value of the multiplexer 566.

The output value from the multiplexer 866 is then stored in a state index update register 868. The state index update register is part of the STAGE 2 760 and is coupled to the output of the multiplexer 866. From the register 868, the state index update value is output from the stage 2 760 to stage 3 770.

In some embodiments, the architecture of the stage 2 760 as described herein may output decoded bins in a small number of clock cycles. The efficient operation of the BADE is promoted by the operation of the offset and range updating block 548 to perform several stages of renormalization in a single cycle, and also by the parallel control of several multiplexers by the single decision block 830.

In some embodiments, stage 3 770 uses inputs 784, 786, 787 that are selected as previously described. Coupling outputs from stage 1 621 to stage 2 720, and from stage 2 720 to stage 3 770 can lead to substantially parallel processing of input stream 510. In other words, bit stream 510 can be decoded substantially faster than in with a single stage CABAC processor.

The internal structure of stage 3 is not shown, but may be similar to the structures of stages 1 and 2, as described herein above and shown in FIGS. 6 and 10B. Moreover, in an embodiment of the video decoder, four binary arithmetic decoder stages are employed, including the three stages shown in the drawings and a fourth stage (not shown) that is coupled to stage 3. The fourth stage may be constituted in a similar manner to the three other stages. Eight LUTs (not shown) may be associated with the fourth stage, instead of the four LUTs 3A, 3B, 3C and 3D shown in association with stage 3 in FIG. 9B. Each of the eight LUTs may have like constituent parts as in the LUTs 3A, 3B, 3C and 3D. Further, the eight LUTs associated with the fourth binary arithmetic decoder stage may be coupled to the fourth binary arithmetic decoder stage by three tiers of multiplexers (not shown) instead of the two tiers of multiplexers 740, 741, 743, 745, 747, 749, 751, 753, 755 shown coupling LUTs 3A, 3B, 3C and 3D to stage 3. As was the case with regard to stage 3, the tiers of multiplexers coupling the eight LUTs to the fourth binary arithmetic decoder stage may operate to select the appropriate state for the fourth stage in accordance with whether the most likely bin value is currently output from each of the stages 1-3.

In other embodiments, any number of two or more binary arithmetic decoder stages may be included.

A single context modeler has been shown herein, to provide context information for the several binary arithmetic decoder stages. In other embodiments, two or more context modelers may be provided so that not every binary arithmetic decoder stage is serviced by the same context modeler.

As used herein and in the appended claims, the "inverse" of a binary value is the other binary value; that is, "1" is the inverse of "0" and "0" is the inverse of "1".

The several embodiments described herein are solely for the purpose of illustration. The various features described herein need not all be used together, and any one or more of those features may be incorporated in a single embodiment. Therefore, persons skilled in the art will recognize from this description that other embodiments may be practiced with various modifications and alterations.

What is claimed is:

1. A binary arithmetic decoding apparatus comprising:
a first pair of look-up tables;
a first multiplexer to select between an output of a first look-up table of said first pair of look-up tables and an output of a second look-up table of said first pair of look-up tables;
a second pair of look-up tables;
a third pair of look-up tables;
a second multiplexer to select between an output of a first look-up table of said second pair of look-up tables and an output of a first look-up table of said third pair of look-up tables; and
a third multiplexer to select between an output of a second look-up table of said second pair of look-up tables and an output of a second look-up table of said third pair of look-up tables;
wherein said first, second and third multiplexers are all controlled by a control signal that is common to said first, second and third multiplexers.

2. The apparatus of claim 1, wherein said pairs of look-up tables and said multiplexers are part of a circuit for decoding a compression-encoded video signal.

3. The apparatus of claim 2, wherein said pairs of look-up tables and said multiplexers are included in binary arithmetic decoding engines.

4. The apparatus of claim 2, wherein:
if a most likely bin value is selected to be a current output bin value, then:
the first multiplexer is controlled to select the output of the first look-up table of said first pair of look-up tables;
the second multiplexer is controlled to select the output of the first look-up table of said second pair of look-up tables; and
the third multiplexer is controlled to select the output of the second look-up table of said second pair of look-up tables; and
if a least likely bin value is selected to be a current output bin value, then:
the first multiplexer is controlled to select the output of the second look-up table of said first pair of look-up tables;
the second multiplexer is controlled to select the output of the first look-up table of said third pair of look-up tables; and
the third multiplexer is controlled to select the output of the second look-up table of said third pair of look-up tables.

5. The apparatus of claim 4, wherein:
the most likely bin value is a first most likely bin value that is provided as an input to a first binary arithmetic decoder stage;
the least likely bin value is a first least likely bin value that is an inverse of the first most likely bin value; and
the current output bin value is a first current output bin value output from the first binary arithmetic decoder stage;
the apparatus further comprising:
a fourth multiplexer to select between an output of said second multiplexer and an output of said third multiplexer;
wherein:
said fourth multiplexer is controlled to select the output of the second multiplexer if a second binary arithmetic decoder stage outputs, as a second current output bin value, a second most likely bin value that is provided as an input to the second binary arithmetic decoder stage; and
said fourth multiplexer is controlled to select the output of the third multiplexer if the second binary arithmetic decoder stage outputs, as said second current output bin value, a second least likely bin value that is an inverse of the second most likely bin value.

6. The apparatus of claim 5, further comprising:
a fourth pair of look-up tables;
a fifth pair of look-up tables;
a fifth multiplexer to select between an output of a first look-up table of said fourth pair of look-up tables and an output of a first look-up table of said fifth pair of look-up tables;
a sixth multiplexer to select between an output of a second look-up table of said fourth pair of look-up tables and an output of a second look-up table of said fifth pair of look-up tables;
a sixth pair of look-up tables;
a seventh pair of look-up tables;
a seventh multiplexer to select between an output of a first look-up table of said sixth pair of look-up tables and an output of a first look-up table of said seventh pair of look-up tables;
an eighth multiplexer to select between an output of a second look-up table of said sixth pair of look-up tables and an output of a second look-up table of said seventh pair of look-up tables;
a ninth multiplexer to select between an output of the fifth multiplexer and an output of the sixth multiplexer; and
a tenth multiplexer to select between an output of the seventh multiplexer and an output of the eighth multiplexer.

7. The apparatus of claim 6, wherein:
if the first most likely bin value is selected by the first binary arithmetic decoder stage to be the first current output bin value, then:
the fifth multiplexer is controlled to select the output of the first look-up table of said fourth pair of look-up tables;
the sixth multiplexer is controlled to select the output of the second look-up table of said fourth pair of look-up tables;
the seventh multiplexer is controlled to select the output of the first look-up table of said sixth pair of look-up tables; and
the eighth multiplexer is controlled to select the output of the second look-up table of said sixth pair of look-up tables; and
if the first least likely bin value is selected by the first binary arithmetic decoder stage to be the first current output bin value, then:
the fifth multiplexer is controlled to select the output of the first look-up table of said fifth pair of look-up tables;
the sixth multiplexer is controlled to select the output of the second look-up table of said fifth pair of look-up tables;
the seventh multiplexer if controlled to select the output of the first look-up table of said seventh pair of look-up tables; and
the eighth multiplexer is controlled to select the output of the second look-up table of said seventh pair of look-up tables.

8. The apparatus of claim 7, wherein:
if the second binary arithmetic decoder stage outputs the second most likely bin value as the second current output bin value, then:
the ninth multiplexer is controlled to select the output of the fifth multiplexer; and
the tenth multiplexer is controlled to select the output of the seventh multiplexer; and
if the second binary arithmetic decoder stage outputs the second least likely bin value as the second current output bin value, then:
the ninth multiplexer is controlled to select the output of the sixth multiplexer; and
the tenth multiplexer is controlled to select the output of the eighth multiplexer.

9. The apparatus of claim 2, wherein the circuit includes at least one context modeler and a plurality of binary arithmetic decoder stages, of which at least one is coupled to at least one of the at least one context modeler, said look-up tables to provide data to said binary arithmetic decoder stages.

10. The apparatus of claim 9, wherein each binary arithmetic decoder stage of said plurality of binary arithmetic decoder stages is coupled either to one of said at least one context modelers or to a preceding one of said plurality of binary arithmetic decoder stages.

11. A system comprising:
a video signal source to supply a compression-encoded video signal; and
a video decoder coupled to the video signal source to decode the compression-encoded video signal supplied by the video signal source, the video decoder comprising:
a first pair of look-up tables;
a first multiplexer to select between an output of a first look-up table of said first pair of look-up tables and an output of a second look-up table of said first pair of look-up tables;
a second pair of look-up tables;
a third pair of look-up tables;
a second multiplexer to select between an output of a first look-up table of said second pair of look-up tables and an output of a first look-up table of said third pair of look-up tables; and
a third multiplexer to select between an output of a second look-up table of said second pair of look-up tables and an output of a second look-up table of said third pair of look-up tables;
wherein said first, second and third multiplexers are all controlled by a control signal that is common to said first, second and third multiplexers.

12. The system of claim 11, wherein:
if a most likely bin value is selected to be a current output bin value, then:
the first multiplexer is controlled to select the output of the first look-up table of said first pair of look-up tables;
the second multiplexer is controlled to select the output of the first look-up table of said second pair of look-up tables; and
the third multiplexer is controlled to select the output of the second look-up table of said second pair of look-up tables; and
if a least likely bin value is selected to be a current output bin value, then:
the first multiplexer is controlled to select the output of the second look-up table of said first pair of look-up tables;
the second multiplexer is controlled to select the output of the first look-up table of said third pair of look-up tables; and
the third multiplexer is controlled to select the output of the second look-up table of said third pair of look-up tables.

13. The system of claim 12, wherein:
the most likely bin value is a first most likely bin value that is provided as an input to a first binary arithmetic decoder stage;
the least likely bin value is a first least likely bin value that is an inverse of the first most likely bin value; and
the current output bin value is a first current output bin value output from the first binary arithmetic decoder stage;
the system further comprising:
a fourth multiplexer to select between an output of said second multiplexer and an output of said third multiplexer;
wherein:
said fourth multiplexer is controlled to select the output of the second multiplexer if a second binary arithmetic decoder stage outputs, as a second current output bin value, a second most likely bin value that is provided as an input to the second binary arithmetic decoder stage; and
said fourth multiplexer is controlled to select the output of the third multiplexer if the second binary arithmetic decoder stage outputs, as said second current output bin value, a second least likely bin value that is an inverse of the second most likely bin value.

14. The system of claim 13, further comprising:
a fourth pair of look-up tables;
a fifth pair of look-up tables;
a fifth multiplexer to select between an output of a first look-up table of said fourth pair of look-up tables and an output of a first look-up table of said fifth pair of look-up tables;
a sixth multiplexer to select between an output of a second look-up table of said fourth pair of look-up tables and an output of a second look-up table of said fifth pair of look-up tables;
a sixth pair of look-up tables;
a seventh pair of look-up tables;
a seventh multiplexer to select between an output of a first look-up table of said sixth pair of look-up tables and an output of a first look-up table of said seventh pair of look-up tables;
an eighth multiplexer to select between an output of a second look-up table of said sixth pair of look-up tables and an output of a second look-up table of said seventh pair of look-up tables;
a ninth multiplexer to select between an output of the fifth multiplexer and an output of the sixth multiplexer; and
a tenth multiplexer to select between an output of the seventh multiplexer and an output of the eighth multiplexer.

15. The system of claim 14, wherein:
if the first most likely bin value is selected by the first binary arithmetic decoder stage to be the first current output bin value, then:
the fifth multiplexer is controlled to select the output of the first look-up table of said fourth pair of look-up tables;

the sixth multiplexer is controlled to select the output of the second look-up table of said fourth pair of look-up tables;

the seventh multiplexer is controlled to select the output of the first look-up table of said sixth pair of look-up tables; and the eighth multiplexer is controlled to select the output of the second look-up table of said sixth pair of look-up tables; and if the first least likely bin value is selected by the first binary arithmetic decoder stage to be the first current output bin value, then:

the fifth multiplexer is controlled to select the output of the first look-up table of said fifth pair of look-up tables;

the sixth multiplexer is controlled to select the output of the second look-up table of said fifth pair of look-up tables;

the seventh multiplexer if controlled to select the output of the first look-up table of said seventh pair of look-up tables; and the eighth multiplexer is controlled to select the output of the second look-up table of said seventh pair of look-up tables.

16. The system of claim 15, wherein:

if the second binary arithmetic decoder stage outputs the second most likely bin value as the second current output bin value, then:

the ninth multiplexer is controlled to select the output of the fifth multiplexer; and the tenth multiplexer is controlled to select the output of the seventh multiplexer; and if the second binary arithmetic decoder stage outputs the second least likely bin value as the second current output bin value, then:

the ninth multiplexer is controlled to select the output of the sixth multiplexer; and the tenth multiplexer is controlled to select the output of the eighth multiplexer.

17. An apparatus comprising:

a first binary arithmetic decoder stage;

a first group of look-up tables coupled to the first binary arithmetic decoder stage to provide update and range data to the first binary arithmetic decoder stage;

a second binary arithmetic decoder stage coupled to the first binary arithmetic decoder stage to receive offset and range data from the first binary arithmetic decoder stage;

a second group of look-up tables;

a third group of look-up tables;

a first group of three multiplexers, each multiplexer of said first group of multiplexers to receive one input from a respective look-up table of the second group of look-up tables and to receive a second input from a respective look-up table of the third group of look-up tables and having an output coupled to said second binary arithmetic decoder stage;

a third binary arithmetic decoder stage coupled to the second binary arithmetic decoder stage to receive offset and range data from the second binary arithmetic decoder stage;

a fourth group of look-up tables;

a fifth group of look-up tables;

a sixth group of look-up tables;

a seventh group of look-up tables;

a second group of three multiplexers, each multiplexer of said second group of multiplexers to receive one input from a respective look-up table of said fourth group of look-up tables and to receive a second input from a respective look-up table of the fifth group of look-up tables;

a third group of three multiplexers, each multiplexer of said third group of multiplexers to receive one input from a respective look-up table of said sixth group of look-up tables and to receive a second input from a respective look-up table of said seventh group of look-up tables; and a fourth group of three multiplexers, each multiplexer of said fourth group of multiplexers to receive one input from a respective multiplexer of said second group of multiplexers and to receive a second input from a respective multiplexer of said third group of multiplexers and having an output coupled to said third binary arithmetic stage.

18. The apparatus of claim 17, wherein each of said binary arithmetic decoder stages includes a respective stage multiplexer to select between two output bin values.

19. The apparatus of claim 18, wherein each of said binary arithmetic decoder stages includes a respective compare block to compare a range value and an offset value and coupled to the respective stage multiplexer to control the respective stage multiplexer.

20. The apparatus of claim 19, wherein each of said binary arithmetic decoder stages further includes at least three further respective stage multiplexers controlled by the respective compare block.

* * * * *